United States Patent
Imai

(10) Patent No.: US 6,327,025 B1
(45) Date of Patent: Dec. 4, 2001

(54) PROJECTION EXPOSURE APPARATUS FOR TRANSFERRING MASK PATTERN ONTO PHOTOSENSITIVE SUBSTRATE

(75) Inventor: Yuji Imai, Saitama-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/722,311

(22) Filed: Nov. 28, 2000

Related U.S. Application Data

(63) Continuation of application No. 09/323,042, filed on Jun. 1, 1999, now Pat. No. 6,195,154, which is a continuation of application No. 08/823,678, filed on Mar. 25, 1997, now abandoned, which is a continuation of application No. 08/436,557, filed on May 8, 1995, now abandoned.

(30) Foreign Application Priority Data

May 18, 1994 (JP) .................................................. 6-103847
Mar. 30, 1995 (JP) .................................................. 7-072874

(51) Int. Cl.[7] .......................... G03B 27/42; G03B 27/52; G03B 27/54; G03F 9/00; A61N 5/00
(52) U.S. Cl. ................. 355/53; 355/55; 355/67; 355/77; 430/5; 430/4; 430/30; 250/492.2; 250/492.22
(58) Field of Search ................. 355/53, 67, 55, 355/77; 430/4, 5, 30; 250/492.2, 492.22

(56) References Cited

U.S. PATENT DOCUMENTS

| | | | |
|---|---|---|---|
| 4,383,757 | * 5/1983 | Phillips | 355/53 |
| 4,629,313 | * 12/1986 | Tanimoto | 355/53 |
| 4,823,014 | * 4/1989 | Miyawaki | 250/561 |
| 4,952,815 | * 8/1990 | Nishi | 250/548 |
| 5,323,016 | * 6/1994 | Yamada et al. | 250/561 |
| 5,461,237 | 10/1995 | Wakamoto et al. | 250/548 |

* cited by examiner

*Primary Examiner*—Russell Adams
*Assistant Examiner*—Khaled Brown
(74) *Attorney, Agent, or Firm*—Armstrong, Westerman, Hattori, McLeland & Naughton, LLP

(57) ABSTRACT

A projection exposure apparatus detects positions at the measurement points (P1–P5) in the Z-direction on the shot area of the wafer W, and obtains the distribution of the irregularity of the shot area based on the detected result and the pre-known process structure data. For example, when the pattern leaving the narrowest line width is exposed in the pattern area (40B), the pattern area (40B) is made as a focusing reference plane and the difference in level ($Z_A-Z_B$) of another area of which reference is pattern area (40B) is added to the level of the best image plane (42) as an offset value. The pattern area (40B) is focused to the best image plane (42) by fitting image plane (42A) to the exposure surface.

24 Claims, 11 Drawing Sheets

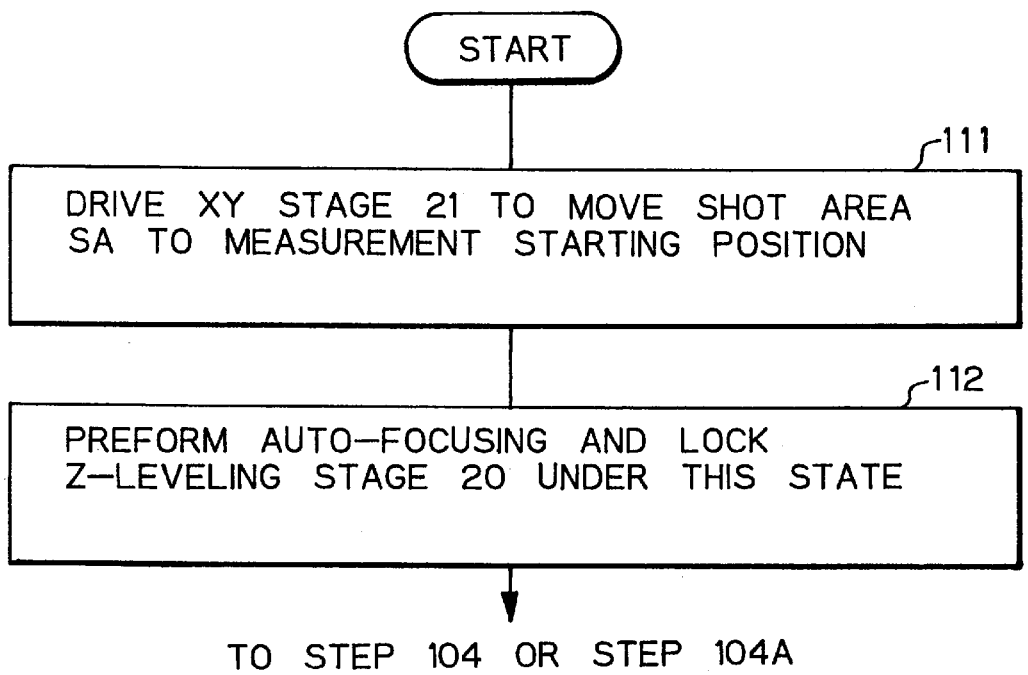
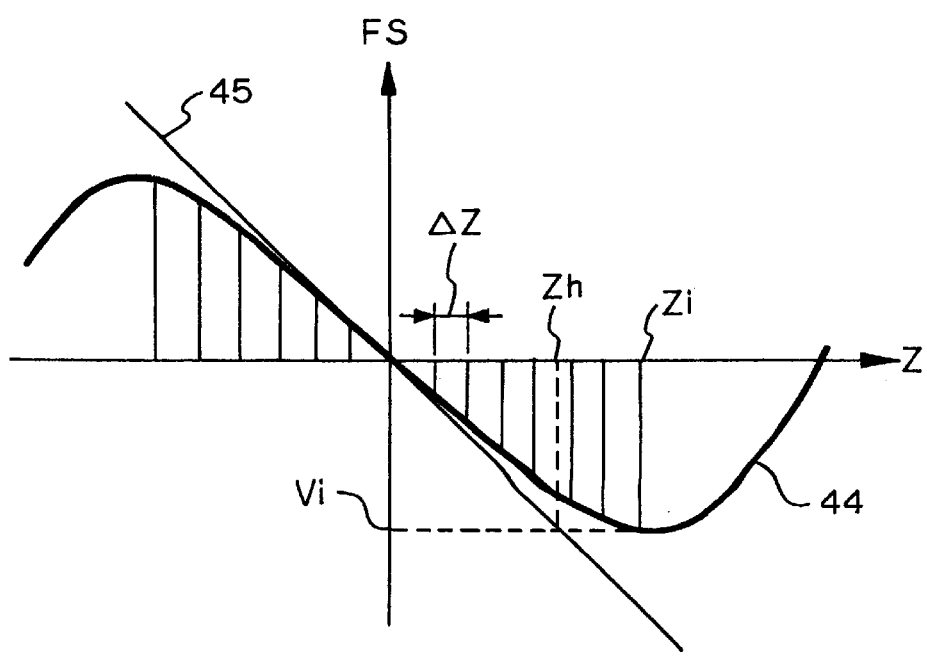

PROJECTION EXPOSURE APPARATUS FOR TRANSFERRING MASK PATTERN ONTO PHOTOSENSITIVE SUBSTRATE

This application is a continuation of U.S. patent application Ser. No. 09/323,042 filed Jun. 1, 1999, now U.S. Pat. No. 6,195,154, which is a continuation of U.S. patent application Ser. No 08/823,678 filed Mar. 25, 1997, now abandoned, which is a continuation of U.S. patent application Ser. No. 08/436,557 filed May 8, 1995, now abandoned.

BACKGROUND OF THE INVENTION

1. Field of the Invention

The present invention relates to a projection exposure apparatus for transferring a mask pattern such as a circuit pattern on a photosensitive substrate, more particularly, it relates to a projection exposure apparatus provided with a focus detection device for focusing on the photosensitive substrate.

2. Related Background Arts

In the conventional projection exposure apparatus, when a pattern of a reticle (a photomask or the like) is projected onto a photosensitive substrate (a wafer, a glass plate or the like on which a photoresist layer is coated) through a projection optical system with a high resolution to expose the substrate, an exposure surface on the photosensitive substrate must be accurately coincided with the image plane of the pattern on the reticle, that is focusing of the pattern of the reticle is necessary. Recently, the focal depth of the projection optical system tends to become narrow. However, a dept of only about ±0.7 $\mu$m can be obtained under the present state though i line having the wavelength of 365 nm is used as an illumination light for exposure. Moreover, a projection visual field of the projection optical system tends to expand year by year, so that it is desirable that a largest focal depth is obtained in all of a board exposure visual field (for example, a square having side of 22 mm).

To achieve satisfactory focusing across the broad exposure visual field, a better flatness of a partial area (shot area) on the photosensitive substrate within the exposure visual field and a better flatness of the image plane (that is, the curvature and the inclination of the image plane are small) must be obtained. The curvature and the inclination of the image plane are mainly dependent on the optical performance of the projection optical system, in addition, they are sometimes dependent on the flatness of the reticle and/or the parallelism between the reticle and the substrate. On the other hand, the flatness of the partial area on the photosensitive substrate, that is the flatness of every projection exposure area (shot area) differs from substrate to substrate. However, the surface in the shot area on the photosensitive substrate can be set in parallel with the image plane by inclining a holder for holding the photosensitive substrate by a small angle.

The methods for performing focusing under consideration of the surface inclination in a one shot area on the photosensitive substrate are disclosed in Japanese Patent Application Laid-Open No. Sho 58-113706 (U.S. Pat. No. 4,558, 979) and Japanese Patent Application Laid-Open No. Sho 55-1348 (U.S. Pat. No. 4,383,757). Particularly, U.S. Pat. No. 4,383,757 discloses the technique, wherein spots of the light beam are projected at four points on a photosensitive substrate through a projection optical system and then a spot image formed by the reflected light is photo-detected to carry out focusing of the photosensitive substrate and correction of the inclination thereof (leveling).

However, since recent semiconductor devices are manufactured by superposing many complex structure patterns on a substrate, the flatness of the exposure surface on the photosensitive substrate becomes worse. Therefore, a technique has been developed wherein an irregular condition in the shot area on the photosensitive substrate is measured and then an average surface in the shot area is focused onto the image plane by the projection optical system based on the measured result. For example, Japanese Patent Application Laid-Open No. Hei 2-198130 (U.S. Pat. No. 5,124,562) discloses a surface position detecting method, wherein photosensitive substrate is fixed in the direction along the optical axis of the projective optical system but moved in the direction perpendicular to the optical axis, the positions (focus position) in the direction along the optical axis of the projective optical system are measured at a plurality of measurement points in the shot area on the photosensitive substrate, and then the average of the measured results is obtained, whereby the offset value of the focus position, which is based on the differences in structure and/or position of the patterns in the shot area, is obtained. In this method, the average focus position is measured in consideration of the irregularities in the shot area by adding the offset value to the measured result of the focus position at each shot area, for example, at the center measurement point.

As described above, in the conventional projection exposure apparatus, the offset value of the focus position is obtained by averaging the focus positions measured at a plurality of specific measurement points. However, in practice, the irregular conditions of the exposure surface in every shot area on the photosensitive substrate vary in accordance with the process construction (such as arrangements and differences in level of patterns), so that, the average surface shape at every shot area can not be obtained accurately only by averaging the focus position at a plurality of specific measurement points. Therefore, if the arrangement, the differences in level and the like of the pattern in every shot area on the photosensitive substrate change, there is a disadvantage that the average surface in every shot area can sometimes not be placed within a range of the focal depth with respect to the image plane of the projection optical system.

Moreover, it is difficult to conform the area to the image plane by the conventional method even when the average surface in every shot does not conform to the image plane, and, an area within the shot area, in which a pattern with the narrowest line width is exposed, is mainly conformed to the image plane.

SUMMARY OF THE INVENTION

It is an object of the present invention to provide a projection exposure apparatus, wherein each shot area can be fitted to an image plane by a projection optical system in an optimum condition and be exposed, irrespective of an irregularity in every shot area on a photosensitive substrate.

It is another object of the present invention to provide a projection exposure apparatus, wherein an offset value for fitting a focusing reference plane on a substrate to an image plane by a projection optical system is obtained based on detected signals corresponding to horizontal displacement values of each of a plurality of images which are re-imaged by a light-receiving optical system, and a process construction of an exposure surface on the substrate, whereby a shot area can be fitted to an image plane in an optimum condition for exposure.

It is a further object of the present invention to provide a projection exposure apparatus, wherein an offset value for fitting a focusing reference plane on a substrate to an image plane by a projection optical system is obtained based on detected signals of a photoelectric detecting device at a plurality of measurement points which are distributed over the entire surface and a process construction of an exposure surface on the substrate, whereby a shot area can be fitted to an imaged surface in an optimum state for exposure.

It is a further object of the present invention to provide a projection exposure apparatus, wherein a wave-length sensitive characteristics of a light beam, which is used when an image of a pattern for detecting a focal point is projected in an exposure area, is uniform in an optical path of an optical system, whereby a shot area can be fitted to an image surface in an optimum state for exposure.

A projection exposure apparatus according to the present invention comprises a projection optical system for projecting a mask pattern onto a photosensitive substrate; a substrate stage for holding the substrate and for positioning the substrate in a plane perpendicular to an optical axis of the projection optical system; a focus leveling stage for adjusting an inclination of the substrate and a level of the substrate in a direction along the optical axis of said projection optical system; a focusing projection optical system for projecting an image of a focus detecting pattern onto a plurality of measurement points in an exposure area by the projection optical system obliquely relative to the optical axis of said projection optical system using a light to which the substrate is not sensitive; a light-receiving optical system for collecting the reflected light from the plurality of measurement points to re-image the focus detecting pattern on said plurality of measurement points; a plurality of photoelectric detecting devices for generating detected signals corresponding to horizontal displacement offset values of a plurality of images which are re-imaged by the light-receiving optical system; and, a control device for obtaining separately for each of said plurality of measurement points an offset value for fitting a focusing reference plane on the substrate to an image plane by said projection optical system with an operating device based on respective detection signals of the photoelectric detecting device corresponding to the plurality of measurement points and a process structure (an arrangement of patterns or difference in level) of an exposure surface on said substrate, and for controlling an operation of the focus leveling stage using said offset value.

In this case, it is desirable that the substrate stage is driven to move the substrate with the image of the focus detecting pattern being projected from the focusing projection optical system onto the exposure area (SA) of the projection optical system, thereby obtaining detected signals by the photoelectric detecting devise, which correspond to said plurality of measurement points distributed over the entire surface in the exposure area (SA), and the arithmetic unit obtains separately an offset value for fitting a focusing reference plane (40B) on said substrate to an image plane of the projection optical system for each of the plurality of measurement points, based on detected signals by the photoelectric detecting device at a plurality of measurement points distributed over the entire surface and the process structure of the exposure surface of the substrate.

It is desirable that a light beam used while the image of the focus-detecting pattern is projected from the focusing projection optical system onto the exposure area of the projection optical system has a bandwidth more than 100 nm.

Further, it is desirable that an optical filter, for making uniform wavelength sensitive characteristics of a light beam which is used when the image of the focus detecting pattern is projected from the focusing projective optical system onto the exposure area of the projection optical system, is located in an optical path from the focusing projection optical system to the plurality of photoelectric detecting devices.

Moreover, the arithmetic unit, preferably, corrects a desirable value corresponding to a level of the image plane of the projection optical system based on the offset values which are obtained separately at each of the plural measurement points.

According to the present invention, as shown in FIG. 8(a), the images of the focus-detecting pattern are projected onto the plurality of measurement points (P1–P5) within the exposure area of the projection optical system on the substrate and re-imaged by the light-receiving system, and the detected signals (FSa–FSe) corresponding to the horizontal displacement values of the re-imaged image are outputted from the photoelectrical detecting device (such as picture elements of the array sensor in FIG. 7). In an oblique incident type, the horizontal displacement value of the re-imaged image is almost proportional to the position (the focus position) of the corresponding measurement point in the direction along the optical axis of the projection optical system. Therefore, the focus positions ($Z_1$–$Z_5$) of the corresponding measurement points can be calculated from the detected signals.

However, in practice, as shown in FIG. 8(a), there is a case that an irregular pattern is formed by the exposure process and the like carried out before then. When there are such irregularities, if a surface on which the pattern with the narrowest line width (for example, it is known that the surface sinks relative to the peripheral portion) is presumed to be the surface (40B), it is desirable that the surface (40B) is coincided with the image plane. In this case, it is understood that if the value (focus position) of the detected signal measured at the measurement point (P3) is minimum, for example, the measurement point (P3) is on the surface (40B). Thus, it is presumed that the surface (40B) is a focusing reference plane on the substrate, and, the detected signals corresponding to difference in level ($Z_A$–$Z_B$) between the reference plane (40B) and another exposure surface (40A, 40C) and obtained based on the process structure date are offset values at other measurement points (P1, P2, P4, P5). The offset value is 0 at the measurement point (P3).

Then, if focusing and leveling are performed based on the value that the offset value is subtracted from the actual, detected signal, the reference plane (40B) is focused on the image plane as shown in FIG. 8(b).

When the plurality of measurement points (P1–P5) are arranged substantially on the diagonal line of the exposure area (SA), for example, as shown in FIG. 5, the detected signals at the measurement points distributed over the entire surface of the exposure area (SA) can be obtained by scanning the substrate in a predetermined direction (X-direction) relative to the projected image of the focus-detecting pattern on the measurement points (P1–P5). Therefore, though complex irregularities are distributed over the entire surface, a predetermined portion of the surface (such as the area exposed by the pattern with the narrowest line width) in which the irregularities are distributed is used as the reference plane, and a detection signal corresponding to the difference in level between the reference plane and other portions is used as an offset value at every measurement point. With this arrangement, the reference surface can be focused.

Next, according to another example of the procedure for performing focusing and leveling, for example, in FIG. 8(a), first, an offset value corresponding to the difference in level ($Z_A$–$Z_5$) between the reference plane (40B) and other surfaces (40A, 40C) is obtained based on the detected signal by the photoelectric detecting device and the process structure, and then the offset value is added to the level of the detected signal corresponding to the level of the image plane. The surface corresponding to the above added result is shown as a dotted-line surface (42A). Thus, with the least square method, the level of the substrate is controlled so as to minimize the difference between the detected signals at the respective measurement points (P1–P5) and the detected signal of the surface (42A), whereby as shown in FIG. 8(b), the reference plane (40B) is focused at an actual image plane.

When the light beam, which is used while the image of the focus-detecting pattern is projected from the focusing projection optical system onto the exposure area (SA) by the projective optical system, has a bandwidth more than 100 nm, the adverse effect and the like by a thin film interference in the photosensitive material (photoresist or the like) on the substrate can be reduced.

Further, when an optical filter, for making uniform the wavelength sensitive characteristics of the light beam used when the image of the pattern for level-detecting is projected from the focusing projection optical system onto the exposure area by the projection optical system, is placed in the optical path from the projection optical system to the plurality of photoelectric detecting devices, even if the light intensity distribution of the focus detecting illumination light for every wavelength is uniform such as, for example, in FIG. 15(a), the transmittance distribution of the optical filter is set, for example, as shown in FIG. 15(b), so that the optical filter has characteristics reverse to the light intensity distribution of the illumination light. With this arrangement, the wavelength characteristics of the detected signal obtained from the photoelectric detecting device becomes flat as shown in FIG. 15(d). Therefore, without large effect by the signal having a specific wavelength, the level can be detected accurately.

BRIEF DESCRIPTION OF THE DRAWINGS

FIG. 12 is a flow chart showing a modified example of the steps 111 and 112 in FIG. 11;

FIG. 13 is a view showing a relation between the detection output signal FS and the position in a Z-axis direction;

DESCRIPTION OF THE PREFERRED EMBODIMENT

Hereunder, a detailed description will be given of one embodiment of a projection exposure apparatus according to the present invention with reference to the drawings.

Figure 1:
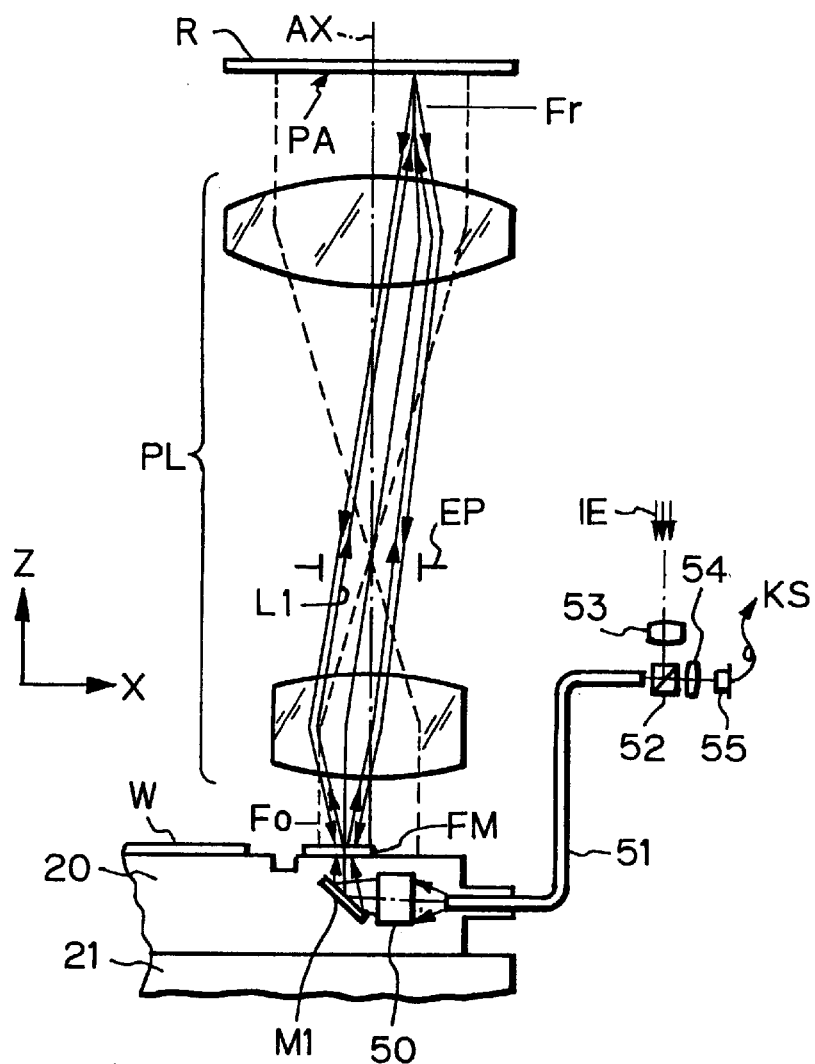
FIG. 1 is a structural view including a partial sectional view showing a detecting mechanism for a best image plane of a projection optical system in one embodiment of a projection exposure apparatus according to the present invention.

FIG. 1 is a view showing a focus detecting system of the TTL (through the lens) type for detecting a best focus plane (image plane) of a projection optical system in the projection exposure apparatus of this embodiment. The focus detecting system of the UTT type in FIG. 1 is disclosed in detail in U.S. Pat. No. 5,241,188. In FIG. 1, a reticle R, of which the undersurface is formed with a pattern area PA of a circuit for manufacturing a real device, is held by a reticle holder, not shown. An optical axis AX of a projection optical system PL, which is shown in a model wherein a front group and a rear group are separated and a diaphragm surface (pupil surface) EP is put therebetween, passes through the center of the reticle R, that is, the center of the pattern area PA, in perpendicular to the reticle pattern surface. It is presumed that a Z-axis is parallel to the optical axis AX, a X-axis is parallel with the paper surface of FIG. 1 in the plane perpendicular to the Z-axis, and a Y-axis is perpendicular to the paper surface of FIG. 1.

Under the projection optical system PL, a Z-leveling stage 20 for holding a wafer W coated with photoresist is placed on a XY stage. The Z-leveling stage 20 moves the wafer W by a micro value (for example, within ±100 μm) in the direction along the optical axis AX to perform focusing, and controls the inclination angle of the wafer W to perform leveling. The XY stage 21 moves the wafer W two-dimensionally in the XY-plane perpendicular to the optical axis AX, and the coordinates of the XY stage 21 in the X-direction and in the Y-direction are measured at all times by means of a laser interferometer, not shown.

Figure 2A:
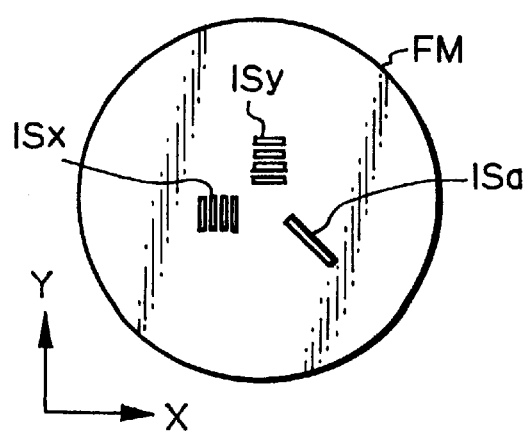
FIG. 2(a) is an enlarged plan view showing an arrangement of a marks on a reference mark plate FM.

Further, a reference mark plate FM is fixed on the upper surface of the Z-leveling stage 20 at substantially the same level position as the surface of the wafer W. As shown in FIG. 2(a), the reference mark plate FM is provided with a slit mark ISy having a plurality of light-transmissible slits extending in the X-direction and arranged in the Y-direction at a constant pitch, a slit mark ISx having a plurality of light-transmissible slits extending in the Y-direction and arranged in the Y-direction at a constant pitch, and a slit mark ISa extending in the direction including by 45° relative to X- and Y-directions, respectively. The entire surface of the quarts reference mark plate FM is evaporated with a chrome layer (shading layer) and is curved so as to form the slit marks ISx, ISy and ISa as transparent parts.

Referring to FIG. 1, a mirror M1 an objective lens 50 and an emission end of an optical fiber are placed under the reference mark plate FM (inside of the Z-leveling stage 20). An illumination light from the emission end of an optical fiber 51 is converged by the objective lens 50 and illuminates the slit marks ISx, ISy and ISa on the reference mark plate FM from the back. A beam splitter 52 is provided near the entrance end side of the optical fiber 51, and an exposure illumination light IE is introduced to the optical fiber 51 through a lens system. The illuminating light IE is desirable to be obtained from a light source (a mercury lamp, and excimer laser light source or the like) for illuminating the retile A, however, another dedicated light source may be prepared. However, when another light source is used, the allumination light must have the same wavelength as the exposure illumination light or must have the very near wavelength.

The illuminating condition of the reference mark plate FM by the objective lens 50 is equalized with the illuminating condition in the projection optical system PL as much as possible when the pattern is projected. That is, the numerical aperture (N.A.) of the illumination light at the image side of the projection optical system PL substantially coincides with the numerical aperture (N.A.) of the illumination light from the objective lens 50 to the reference mark plate, FM. Now, with this arrangement, when the illumination light IE is introduced into the optical fiber 51, an image light beam entering into the projection optical system PL is produced from the slit marks ISx, ISy and ISa on the reference mark plate FM. In FIG. 1, the position of the Z-leveling stage 20 in the direction along the optical axis AX is set such that the surface of the reference mark plate FM is positioned slightly under the best image plane Fo (the conjugate surface with the reticle) of the projection optical system PL. In this case, an image light beam L1 emitted from one point on the reference mark plate FM, passes through the center of the pupil surface EP in the projection optical system PL, and converges on the surface Fr slightly shifted under the pattern surface of the reticle R and then diverges, thereafter, it reflects on the pattern surface of the reticle R and returns along the original optical path. The surface Fr is positioned so as to be optically conjugate with the reference mark plate FM with respect to the projection optical system PL. When the projection optical system PL is a double telecentric system, the image light beam on the reference mark plate FM from the slits mark ISx, ISy and ISa is reflected regularly and returns so as to coincide with the slit marks ISx, ISy and ISa.

Figure 2B:
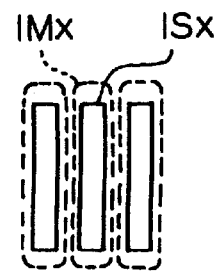
FIG. 2(b) is an enlarged view showing a relation between an image, which is re-imaged on the reference mark plate FM, and the marks.

However, as shown in FIG. 1, when the reference mark plate FM is displaced from the image plane Fo, fade reflected images of the respective slit mark ISx, ISy and ISa are formed on the reference mark plate FM. On the other hand, when the reference mark plate FM coincides with the image plane Fo, the surface Fr also coincides with the pattern surface of the reticle. Therefore, sharp reflected images of the respective slit marks ISx, ISy and ISa are formed on the reference mark plate FM so as to coincide with the respective marks. FIG. 2(b) shows typically the relation between the slit mark ISx when the reference mark plate FM defocuses and the reflected image IMx. In the double telecentric projection optical system PL, the reflected image IMx is projected on the slit mark ISx which is its source, like this. When the reference mark plate FM is defocused, the reflected image IMx becomes larger that the slit mark ISx in the geometry and the illuminance per unit area is reduced.

Therefore, the light beam of the image portions which are not shaded by the original slit marks ISx, ISy and ISa among the reflected images formed on the reference mark plate FM, is introduced into the optical fiber 51 through the mirror M1 and the objective lens 50 and the light beam emitted from the optical fiber 51 is received by a photoelectric sensor 55 through the beam splitter 52 and the lens system 54. The light-receiving surface of the photo-electric sensor 55 is placed at a position that is conjugate with the pupil surface (Fourier transformation surface) EP of the projection optical system PL. In FIG. 1 a contrast signal can be obtained for determining the imaged surface of the projection optical system PL only by moving the Z-leveling stage 20 upwardly (in the Z-direction).

Figure 3A:
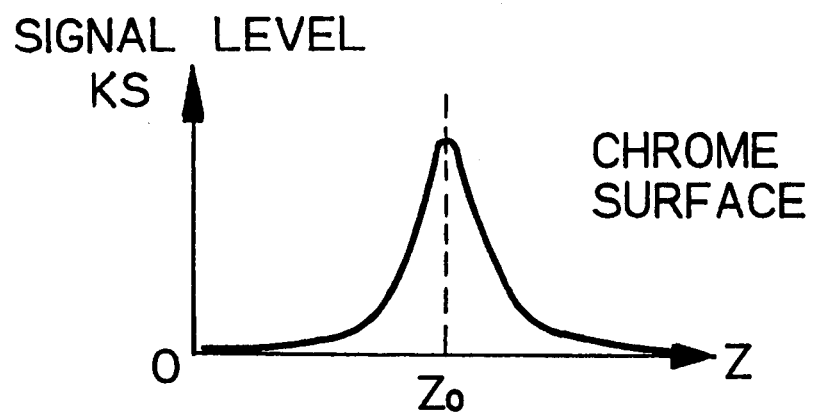
FIGS. 3(a) and 3(b) are views showing respective changes in level of signals KS-outputted from the detecting mechanism in FIG. 1.
Figure 3B:
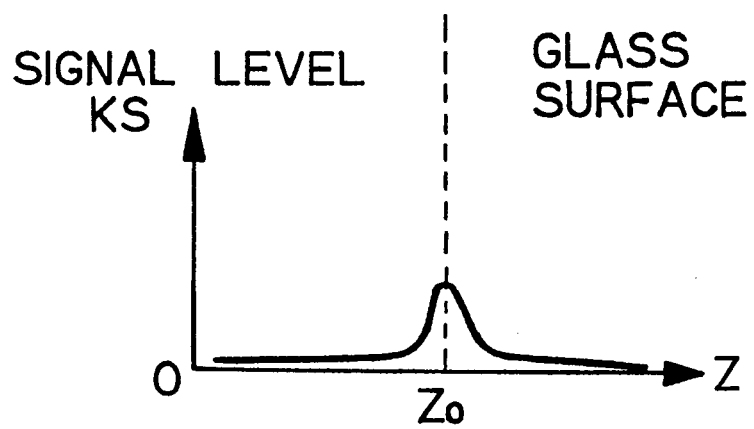

FIGS. 3(a) and 3(b) show the respective signal level characteristics of the output signal KS of the photoelectric sensor 55, and the horizontal axis indicates the position of the Z-leveling stage 20 in the Z-direction, that is, the height of the reference mark plate FM in the direction along the optical axis AX. FIG. 3(a) show the signal level when the slit marks ISx, ISy and ISa are projected onto the chrome portion in the pattern surface on the reticle R, and FIG. 3(b) shows the signal level when these slit marks are projected onto the glass portion (transparent portion) in the pattern surface. Generally, the chrome portion of the reticle is evaporated to a glass (quartz) plate with the thickness of about 0.3–0.5 $\mu$m, thus, the reflectance of the chrome portion is much larger than that of the glass portion. However, since the reflectance of the glass portion does not become to zero, the signal level is very low as shown in FIG. 3(b) but can be detected at the glass portion. Further, a reticle for manufacturing a real device has a high density pattern in general, so that there may be little probability that the projected images of all of the slit marks ISx, ISy and ISa are formed on the glass portion (transparent portion) in the reticle pattern.

In any case, when the surface of the reference mark plate FM is moved in the direction along the optical axis AX so as to across the best image plane Fo, the level of the output signal KS becomes the maximum value at the position Zo in the Z-direction. Therefore, the position of the best image plane Fo can be obtained by measuring the position of the Z-leveling stage 20 in the Z-direction and the output signal KS at the same time, and detecting the position in the Z-direction when the level of the output signal KS reaches the maximum. Moreover, with this detecting method, the best imaged surface Fo can be detected at any position on the reticle R. Therefore, whenever the reticle R is set at a side of the object plane of the projection optical system PL, the absolute focus position (the best image plane Fo) can be measured at any positions in the projection visual field of the projection optical system PL. And, as described above, the chrome layer of the reticle R has the thickness of 0.3–0.5 $\mu$m, and when the projection magnification of the projection optical system PL is set at ⅕ (reduction), the detected error of the best image plane Fo caused by this thickness is (0.3–0.5)×(⅕)$^2$, that is, 0.012–0.02 $\mu$m, this error can be neglected.

Figure 4:
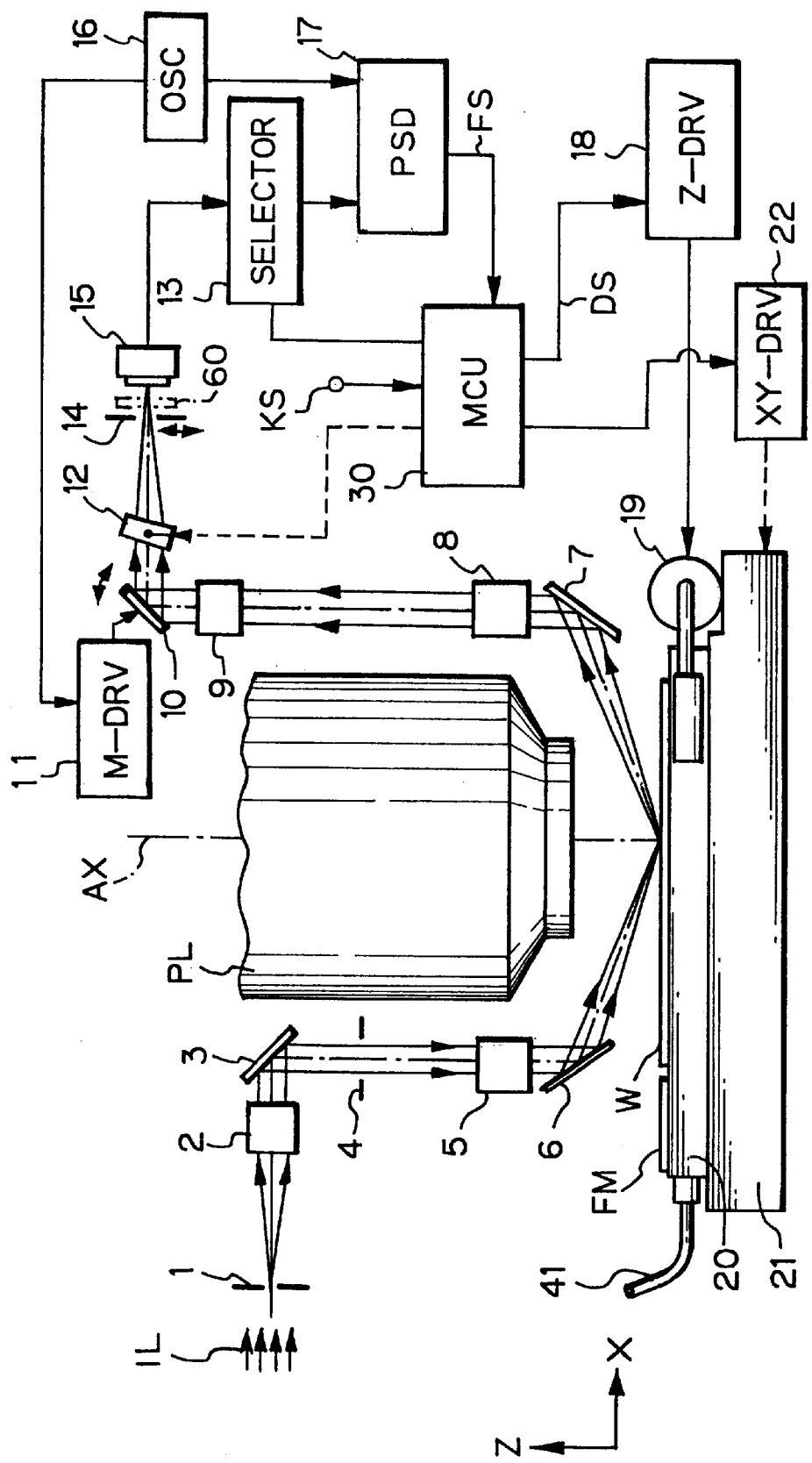
FIG. 4 is a structural view showing an optical system and a control system of a multipoint AF system in the embodiment.

Next, with reference to FIG. 4, an explanation will be given to an oblique incidence type AF system (a focus position detecting system) of this embodiment, but a multipoint AF type will be used in this explanation. The multipoint AF system is provided with measurement points for measuring a positional offset of the wafer-W in the direction along the optical-axis (that is, focus dislocation) at plural points in the projection visual field of the projection optical system PL. In FIG. 4, an illumination light IL to which is the photoresist on the wafer W is non-sensitive, is irradiated from a light source such as a halogen lamp, not shown, and illuminates a slit plate 1. Then, the light passed through a slit of the slit plate 1, illuminates obliquely the wafer W through a lens system 2, a mirror A, a diaphragm 4, a projection objective lens 5 and a mirror 6. In this case, when the surface of the wafer W is in the best image plane Fo, the image of the slit in the slit plate 1 is imaged on the surface of the wafer W by means of the lens system 2 and the objective lens 5. And, the angle between the optical axis of the objective lens 5 and the surface of the wafer is set at 5–12° and the center of the slit image of the slit plate 1 is positioned at the point where the optical axis AX of the projection optical system PL crosses with the wafer W.

Now, the light beam of the slit image, which is reflected by the wafer, form again a slit image on a light-receiving slit plate 14 through a mirror 7, a light-receiving objective lens 8, a lens system 9, an oscillating mirror 10 and a plane parallel plate (plane parallel) 12. The oscillating mirror 10 oscillates by a minute amplitude the slit image on the light-receiving slit plate 14 in the direction perpendicular to the longitudinal direction of the slit image. On the other hand, the plane parallel 12 shifts the relation between the slit on the slit plate 14 and the center of oscillation of the slit image formed by the reflected light from the wafer W in the direction perpendicular to the longitudinal direction of the slit. The oscillating mirror 10 is oscillated by the mirror drive (M-DRV) 11 which is driven by the driving signal from the oscillator (OSC) 16.

In this way, if the slit image oscillates on the light-receiving slit plate 14, the light beam which have passed through the slit plate 14 is received by an array sensor 15. The array sensor 15 is divided along the longitudinal direction the slit in the slit plate 14 into a plurality of small areas and individual receiving picture elements are disposed in the respective small areas. A silicon photodiode, a phototransistor or the like is used as a photoelectric transfer element in the array sensor. The signals from the respective receiving picture elements in the array sensor 15 are selected or grouped through the selector circuit 13 and then supplied to a synchronous detection circuit (PSD) 17. The synchronous detection circuit 17 is supplied with an AC signal which has a same phase as the driving signal from the oscillator 16, and the signals from the receiving picture elements are rectified synchronously based on the phase of the AC signal.

In this case, the synchronous detection circuit 17 is provided with a plurality of detecting circuits for synchronously and individually detecting the respective output signals of the plurality of receiving picture elements which are selected among the array sensor 15, and the respective detection output signals FS are supplied to the main control unit (MCU) 30. The respective detention output signals FS are referred to as S curve signals, and become the zero level when the center of the slit in the light-receiving slit plate 14 coincides with the center of oscillation of the reflected slit image from the wafer W, the positive level when the wafer W shifts upper than that state and the negative level when the wafer W shifts lower. Therefore, when the detection output signal FS becomes the zero level, the vertical position of the exposure surface (for example, the surface) on the wafer W is detected as a focused point. However, it is not assured that in this oblique incidence type, the vertical position of the wafer W at the focused point (the detection output signal FS is the zero level) always coincides with the best image plane Fo at any time. That is, the oblique incidence type has a virtual reference plane which is determined by the system itself, and when the virtual reference plane coincides with the exposure surface on the wafer W the detection output signal FS from the synchronous detection circuit 17 reaches the zero level. The virtual reference plane is set so as to be coincided with the best image plane Fo when an apparatus is manufactured, but this coincidence is not guaranteed to be maintained for a long period. Therefore, the best image plane Fo is detected, for example, by means of the focus detecting system in FIG. 1, and the plane parallel 12 in FIG. 4 is inclined by controlling with the main control unit 30 based on this detected best image plane Fo to shift the virtual reference plane in the direction along the optical axis AM, whereby the virtual reference plane can be coincided with the best image plane Fo (or, the positional relation can be determined). A calibration action in this oblique incidence type AF system is disclosed in detail in U.S. patent application Ser. No. 113,815 (Aug. 31, 1993) assigned to the assignee of this application and, therefore, the detailed explanation thereof will be omitted.

The main control unit 30 receives the output signal KS from the photoelectric sensor 55 in FIG. 1 and functions to calibrate the multipoint AF system of the oblique incidence type, output a command signal DS to the drive (Z-DRV) 18 for driving the drive motor 19 of the Z-leveling stage 20 based on the respective detection output signals FS in the multipoint AF system and control the drive (the motor and the control circuit thereof are included) 22 for driving the XY stage 21.

Figure 5:
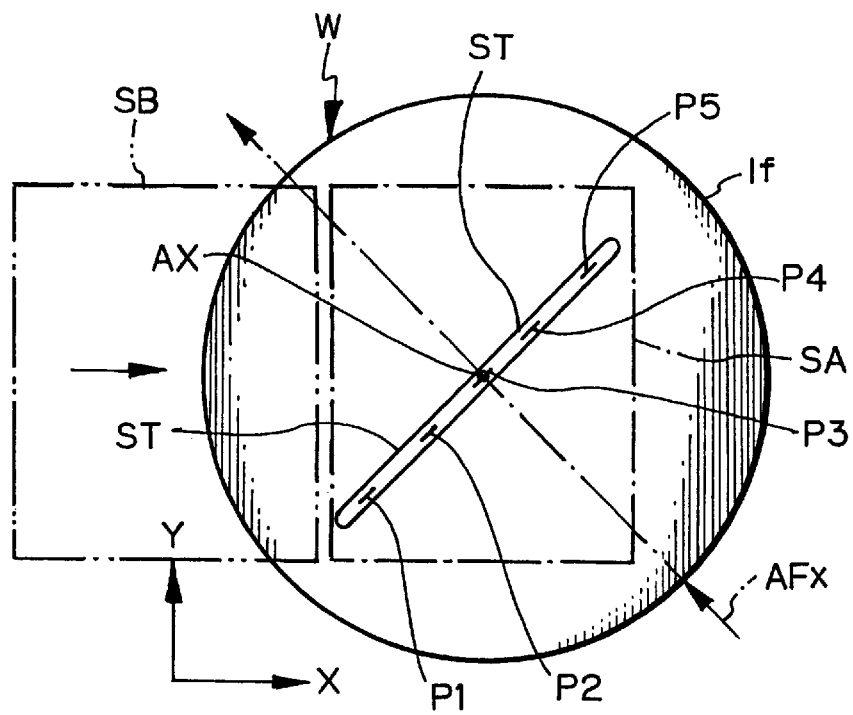
FIG. 5 is a view showing a slit image projected in an exposure field of a projection optical system PL by means of the multipoint AF system in FIG. 4.

FIG. 5 is a view showing positional relation between the projection visual field If of the projection optical system PL and the slit image ST projected from the multi-point AF system onto the surface of the wafer W. The projection visual field If is generally circular and the shot area SA to which the pattern image in the pattern area PA of the reticle R is projected in a rectangle included in the circle. The slit image ST is projected onto the wafer W with its longitudinal axis being inclined by 45° with respect to the X-axis and the Y-axis, which are moving coordinate axes of the XY stage 21. The projection of the optical axes AFx of the projection objective lens 5 and the receiving objective lens 8 to the wafer extends in the direction perpendicular to the slit image ST. Moreover, the center of the slit image ST is set so as to substantially coincide with the optical axis AX. With this arrangement, the slit image ST is set so as to extend in the shot area GA as long as possible.

Generally, a circuit pattern, which has irregularities formed by an exposure step and the like till then, is formed in the shot area SA. In this case, as many processes for manufacturing a device are practiced repeatedly, variations in the irregularity will increase, and the irregularity will increase in the longitudinal direction of the slit image ST. Particularly, in the case where a plurality of chip patterns are arranged in one shot, scribe lines for separating the respective chip patterns extending in the X-direction or the Y-direction are formed, so that differences in level more than 2 $\mu$m are created in an extreme case between points on the scribe lines and points on the chip patterns. The position where the scribe lines are formed in the slit image ST is known previously by the shot array in the design, the chip size in the shot and the like, so that it is possible to determine that a reflected light from any portion of the slit image ST in the longitudinal direction is either of the reflected light from the circuit pattern and the reflected right from the scribe line.

Figure 6:
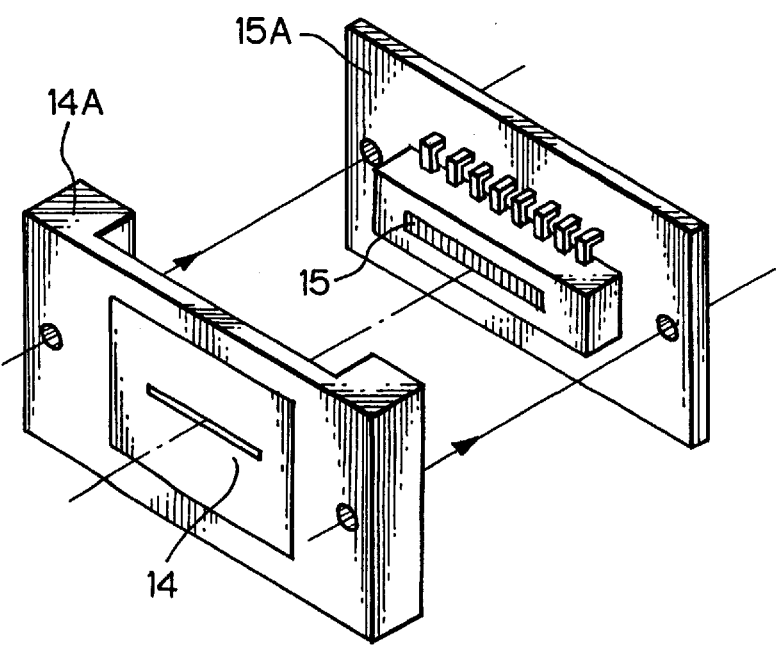
FIG. 6 is a disassembled perspective view showing a relation between a slit plate 14 and an array sensor 15 in FIG. 4.

FIG. 6 shows a state in which the light-receiving slit plate 14 and the array sensor 15 are separated. In FIG. 6, the slit plate 14 is deposited with a chrome layer (shading layer) on the entire surface of the glass substrate plate, and a transparent slit is formed at one portion thereof by etching. The slit plate 14 is fixed on a holding frame 14A, and the holding frame 14A is fixed on a print substrate 15A made of such as ceramics for holding the array sensor 15 by means of screws, not shown. With this arrangement, the slit of the slit plate 14 is arranged so that it becomes parallel to the one-dimensional array of the receiving picture elements in the array sensor 15 and contacts with the light-receiving picture elements. It is preferable that the slit plate 14 and the array sensor 15 are approached or contacted as closely as possible, but, and imaging lens system may be provided between the slit plate 14 and the array sensor 15, whereby the slit plate 14 and he array sensor 15 may be optically conjugated with each other. Incidentally, the length of the slit image ST on the wafer shown in FIG. 5 varies in accordance with the diameter of the projection visual field If, but, if the magnification of the projection optical system PL is ⅕ (reduction) and the diameter of the projection visual field If is about 32 mm; the length is preferred to be between 1 and ⅓ times as large as the diameter of the projection visual field If.

Figure 7:
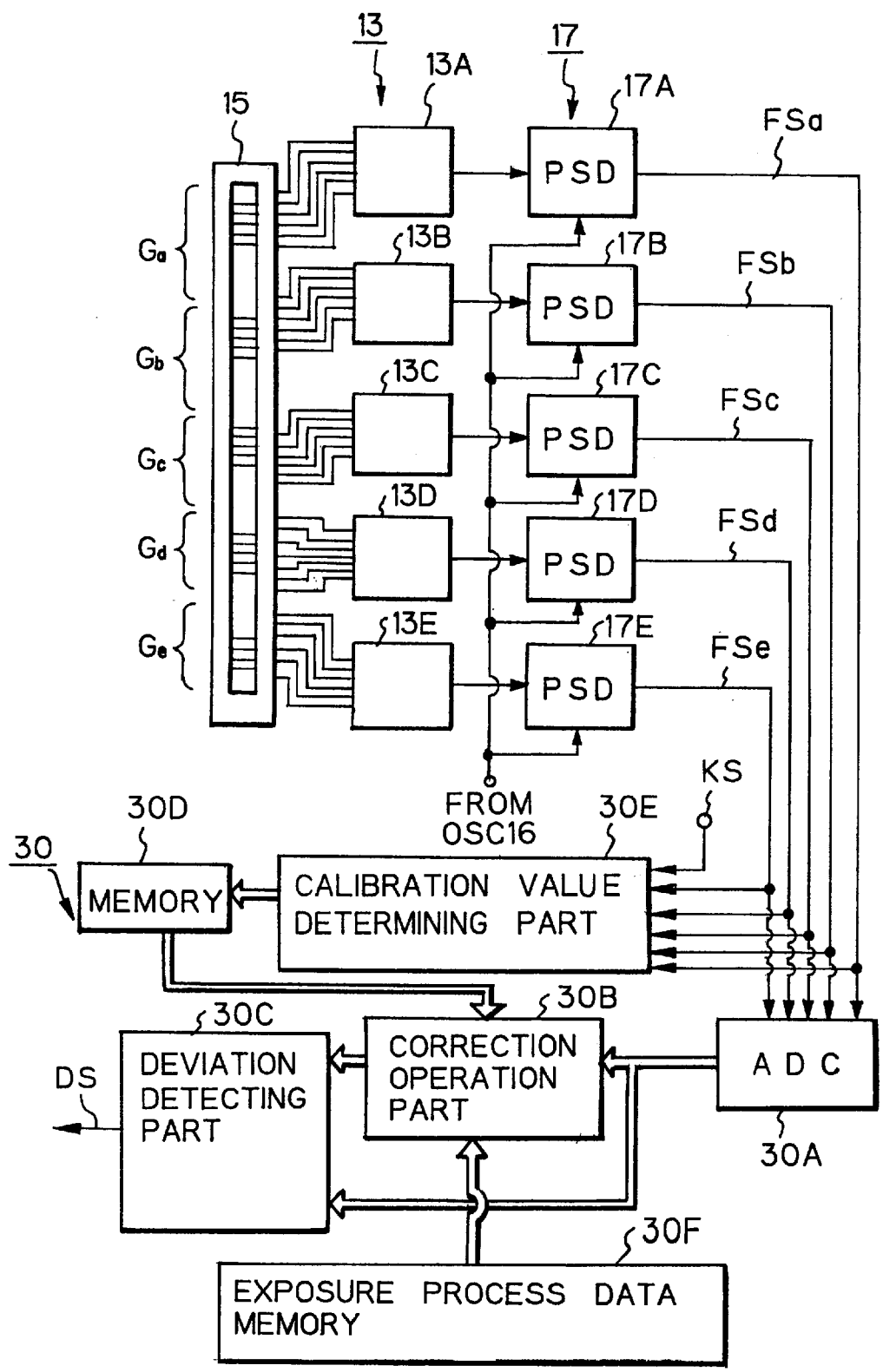
FIG. 7 is a block diagram showing a detailed construction of an array sensor 15, A selector circuit 13, a synchronous wave detection circuit 17 and a main control system 30 in FIG. 4.

FIG. 7 shows one example of a concrete circuit construction including the array sensor 15, the selector circuit 13, the synchronous detection circuit 17 and the main control unit 30. In FIG. 7, the selector circuit 13 is composed of five selector circuit sections 13A–13E, and the synchronous detection circuit 17 is composed of five synchronous detection circuit sections 17A–17E. A receiving picture element in the array sensor 15 is divided into five groups Ga to Ge, and one receiving picture element is selected from every group by the selector circuit 13. In this case, the groups Ga–Ge detect respectively the slit images before and behind five measurement points P1–P5 along the slit image ST in FIG. 5. Further, in one example, in the selector circuit selections 13A–13E, detected signals of the receiving picture elements which receive the slit images on the measurement points P1–P5 are selected.

Concretely, in FIG. 7, the group Ga of the receiving picture elements in the array sensor 15 includes therein a plurality of receiving picture elements, the receiving picture element, which detects the image on the measurement point P1, is selected by means of the selector circuit section 13A among the receiving picture elements, and then the output signal of the receiving picture element is supplied to the synchronous detection circuit 17A. In addition, the selector circuit section 13A functions to select any one of receiving picture elements in the group Ga to send the output signal thereof to the synchronous detection circuit section 17A and arbitrarily select adjacent two or three receiving picture elements to send a signal, to which these output signals are added, to the synchronous detection circuit section 17A. Similarly, the output signals from the receiving picture elements in the groups Gb–Ge are selected in the selector circuit sections 13B–13E, respectively, and the selected output signals are supplied to the synchronous detection circuit sections 17B–17E, respectively.

The synchronous detection circuits 17A–17E receive the respective fundamental wave alternating signals from the oscillator 16 and output the detection output signals FSa–FSe, respectively. These detection output signals FSa–FSe are respectively converted to digital data by means of an analog/digital converter (ADC) 30A in the main control unit 30 and then supplied to a correction operation part 30B and a deviation detecting part 30C. The correction operation part 30B also receives a data concerning the process structure of the wafer (including the data regarding the distribution of the irregularity on the exposure surface and the difference in level of the irregularity) from an exposure process data memory 30F, and an offset value for calibrating the signal from a memory 30D. Then, the correction operation part 30B calculates detection output values corresponding to target positions in the Z-direction at the respective measurement points on the wafer based on, for example, five detection output signal values, that is, the focus displacement values at five points on the wafer, the data concerning the process structure and the like, and supplies the values to the deviation detecting part 30C. The deviation detecting part 30C detects the deviation between the output value from the correction operation part 30B and the detection output value from the ADC 30A, and then supplies a command signal DS to the drive 18 shown in FIG. 14 so as to decrease the deviation.

Concretely, for example, the deviation detecting part 30C controls the drive 18 so as to minimize the square sum of the deviation between the detection output signal as a target from the correction calculating part 30B and the detection output signals FSa–FSe, that is, by the least square method. With this arrangement, the position in the Z-direction of the Z-leveling stage 20 and the inclination thereof are controlled and an average surface of the measurement points P1–P5 in FIG. 5 is focused so as to coincide with the image plane of the projection optical system PL.

Incidentally, in FIG. 5, since the measurement points P1–P5 are arranged on one line, the inclination to be controlled is only the inclination of the axis which is the straight line perpendicular to the slit image ST on the surface of the wafer W. To control the inclination about two orthogonal axes on the wafer W, the measurement points P1–P5 are arrayed two-dimensionally (for example, a plurality of pattern images are arranged in parallel, or formed so as to cross one another), or the shot area SA on the wafer W is scanned in a predetermined direction with respect to the slit image and then the distribution in the level of the all shot area SA may be measured.

In FIG. 7, the offset value, which is previously memorized in the memory 30D, is measured and calculated by a calibration value determining part 30E. The calibration value determining part 30E obtains the deviation between the virtual reference plane in the multipoint AF system and the best focus plane Fo as a deviation voltage from the zero-level of the detected output based on five detection output signals FSa–FSe and the output signal from the photo-electric sensor 55. The calibration determining part 30E includes an analog-digital converter for digital-sampling the respective level of five detection outputs and the signal KS (See FIG. 3) at the same time, a waveform memory and the like.

Figure 9:
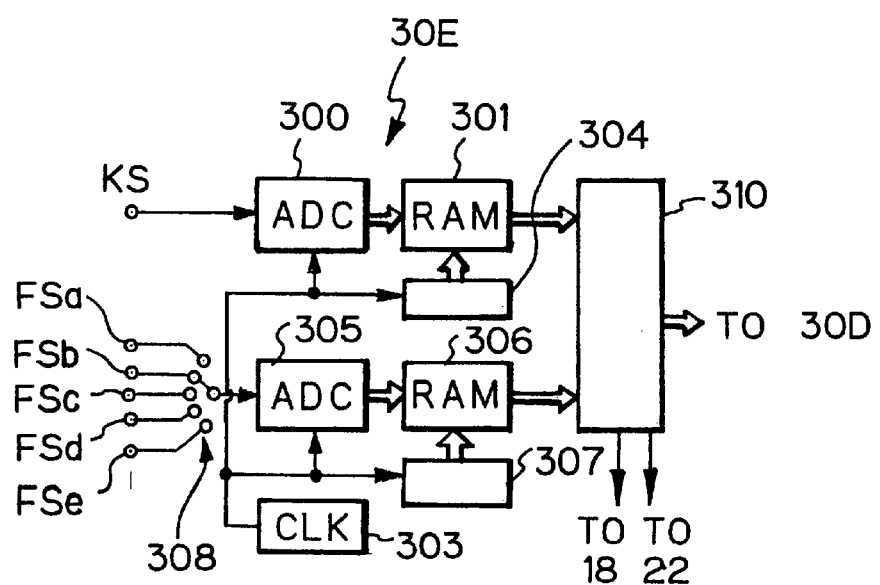
FIG. 9 is a block diagram showing a structural example of the correction value decision part 30E in FIG. 7.

Referring to FIG. 9, an explanation will be given to an embodiment of the calibration value determining part 30E. First, the output signal KS from the photoelectric sensor 55 in an absolute focus detecting system of the TTL (through the lens) type is inputted to an analog-digital converter (ADC) 300, and then converted to a digital value corresponding to the signal level so as to be memorized in a RAM 301 as a memory. The addressing of the RAM 301 is performed by a counter 304, and both of the counting of the counter 304 and the conversion timing of the ADC 300 are synchronous with the clock pulse from the clock generator (CLK) 303. Similarly, one of the five detection output signals FSa–FSe is supplied to an ADC 305 through a selecting switch 308, and the digital value converted therein is memorized in a RAM 306, in which the addressing is performed by a counter 307. Therefore, the waveform of the output signal and one selected, detection output signal, which vary with time, are received in the RAM units 301 and 306. The waveforms in the RAMs 301 and 306 are used as processing data in a processing part 310 when a smoothening, a detection of a maximum value and the like are performed.

Further, the processing part 310 outputs a signal for controlling the uniform movement of the Z-leveling stage 20 in the Z-direction to the drive 18 so as to take the signal waveforms in the RAMs 301 and 306, and outputs the drive signals to the drive 22 for the XY stage shown in FIG. 4 for moving the centers of the slit marks ISx, ISy and ISa in FIG. 2(a) to the respective measuring points of the multipoint AF system.

Figure 10:
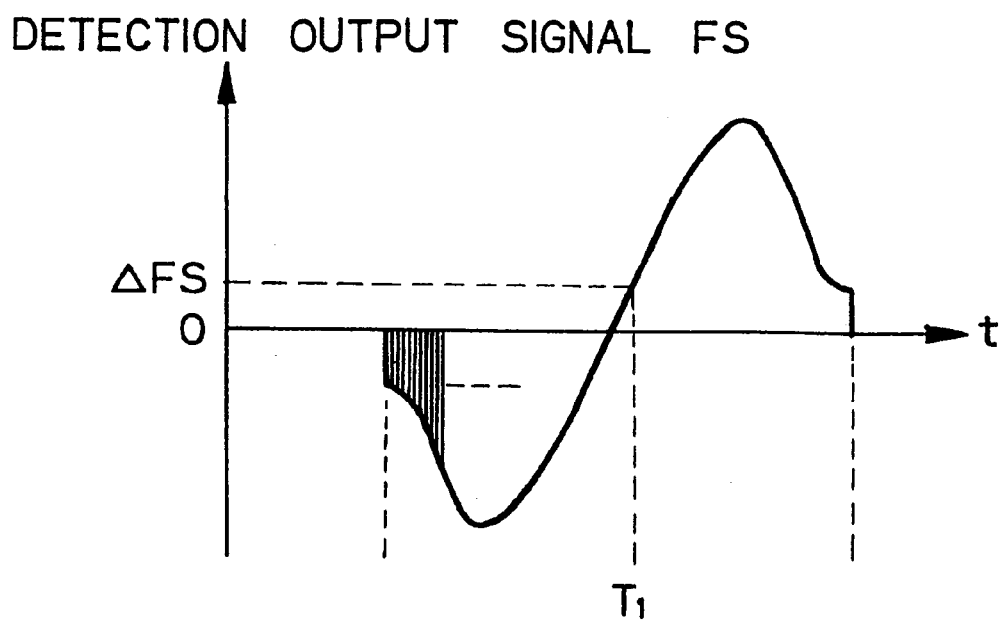
FIGS. 10(a) and 10(b) are respective views showing relations of a detection output signal FS and a signal KS.
Figure 10:
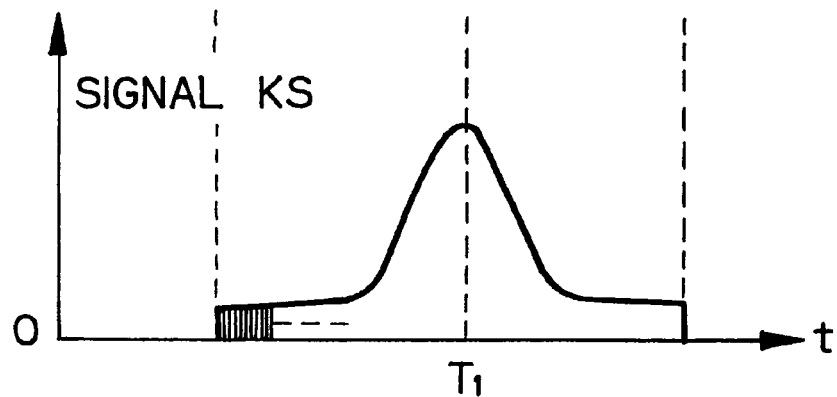

FIG. 10(a) shows a waveform of variation characteristics in one detect output signal FS. The waveform corresponds to a waveform data which is stored in the RAM 306 when the Z-leveling stage 20 moves at a constant speed in the Z-direction within a limited area including the best focus plane. FIG. 10(b) shows the waveform of the signal KS which is stored in the RAM 301 at that time. The synchronous direction signal becomes a substantial point symmetric waveform with respect to the zero point and, therefore, a negative level data smaller than the zero point is analog-digitally converted by taking the negative level into consideration.

In the RAM 301 in FIG. 9, the waveform at the maximum value of the signal KS shown in FIG. 10(b) is stored in the address corresponding to the time t, so that the processing part 310 analyzes the waveform and obtains the time $T_1$ at which the maximum point can be obtained. Then, the processing part 310 obtains an address point which corresponds to the time $T_1$ in the RAM 306 and obtains a level $\Delta$FS of the detection output signal stored in the address point. The level $\Delta$FS is an offset voltage from the zero point of the detection output signal FS. At the measurement point in the multipoint AF system which generates the detection output as shown in FIG. 10(a), when the wafer surface at the measurement point is moved in the Z-direction in such a manner that the detection output is +$\Delta$FS, the wafer surface coincides with the best focus plane Fo.

Incidentally, when the circuit in FIG. 9 is used, the slit mark on the reference mark plate FM is positioned in such a manner that the center thereof is positioned at one of the respective measurement points in the AF system, by moving the XY stage 21 shown in FIG. 4. This positioning is not necessary to be strict. The measurement point in the multipoint AF system may be displaced from the center of the slit mark group by about 100 $\mu$m in the X-direction and the Y-direction. Therefore, when the measurement points in the AF system, that is, the measurement points P1–P5 in the slit image ST shown in FIG. 5 are determined, the position of the slit mark group is moved relative to these measurement points within a range of about ±100 $\mu$m in the X-direction and the Y-direction and is tilted in the Z-direction, whereby the coordinate position at which the peak of the signal KS becomes large to some extent may be obtained. This is to avoid the disadvantage as much as possible that all of the slit mark group coincide with the transparent portion of the reticle R (the SN ratio of the signal KS lowers), although the probability is very low. However, when the calibration is performed at a high speed, the offset value $\Delta$FS can be obtained with similar accuracy though the coordinate position at which the peak of the signal becomes large is not searched. The offset values can be obtained for the respective measurement points P1–P5.

In this way, the values of the detection output signals FSa–FSe when the respective measurement points P1–P5 coincide with the position of the best image plane in the Z-direction by the projection optical system PL, that is, the offset values BFa–BFe at the best image plane can be obtained. In FIG. 5, when the short area AS is scanned, for example, in the X-direction with respect to the slit image ST so as to obtain the detection output signals at the measurement points which are distributed on the entire surface of the short area SA, the offset value at each measurement point is one of the offset values BFa–BFe which are obtained as described above.

Next, an explanation will be given to an example of the focusing and the exposure action in this embodiment with reference to FIGS. 5, 8, 11 and 12. In this case, it is presumed that the values of the detection output signals FSa–FSe when the measurement points P1–P5 in FIG. 5 are respectively focused on the image plane of the projection optical system PL, that is, the offset values BFa–BFe of the image plane with respect to a virtual reference plane in the multipoint AF system, are measured previously. If the rotation angle of the plane parallel 12 is adjusted, the offset values BFa–BFe can be made substantial 0 (zero), so that, the offset values BFa–BFe are values near to 0. The travelling surface along which the Z-leveling stage 20 moves when the XY stage 21 is driven and the best image plane of the projection optical system PL are substantially parallel.

Figure 11:
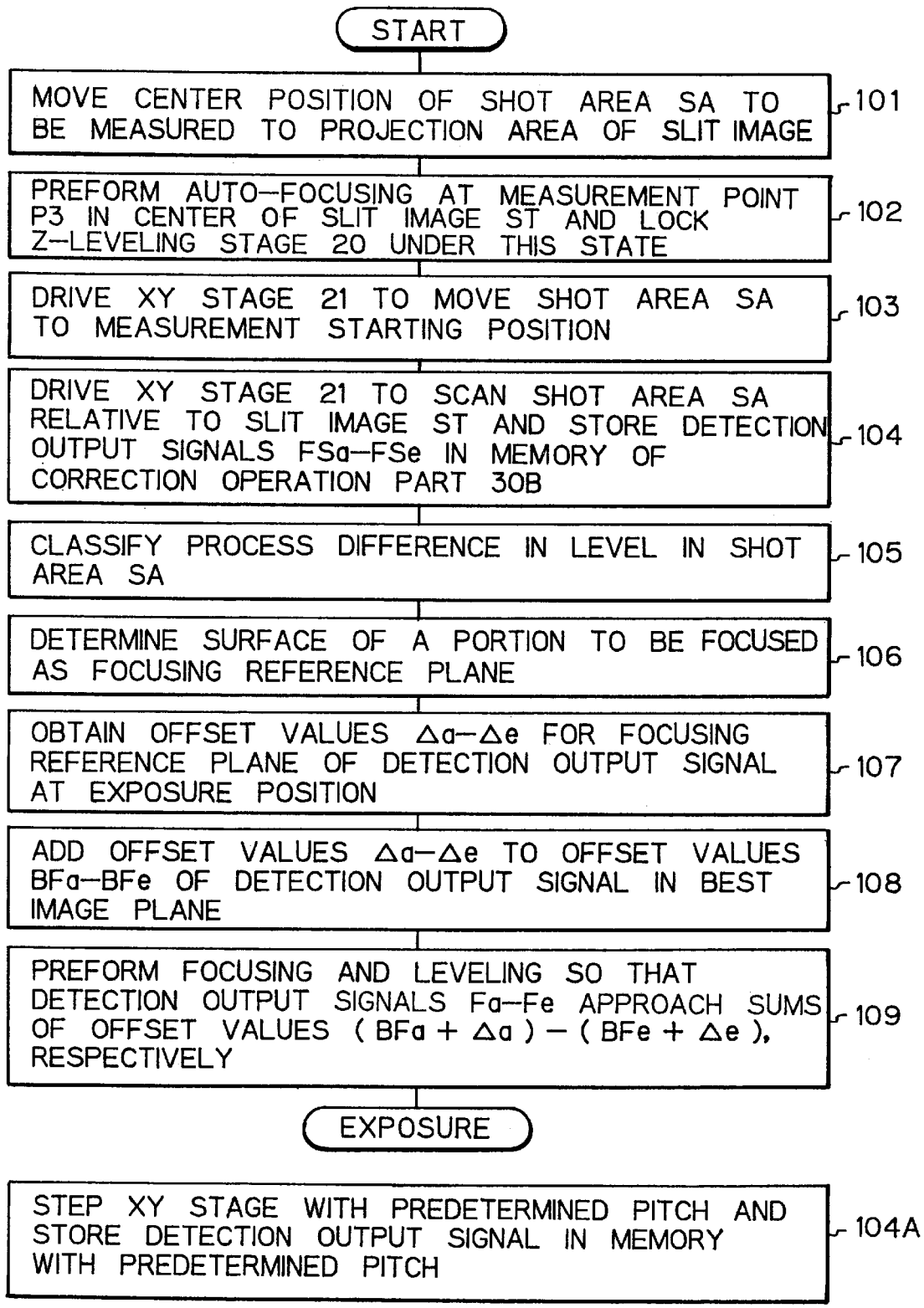
FIG. 11 is a flow chart showing one example of the focus point detection operation and the exposure operation in the embodiment.

First, in the Step 101 in FIG. 11, the XY stage is driven so as to move the center portion of the short area SA to be measured (exposed) onto the projection area of the slit image ST from the oblique incident multipoint AF system as shown in FIG. 5. Then, in the step 102, the autofocus is performed at the measurement point P3, that is, the center of the slit image ST. That is, the height of the Z-leveling stage 20 in the Z-direction is adjusted in such a manner that the detection output signal FSc corresponding to the measurement point P3 becomes the offset value BFc of the best image plane, and then the Z-leveling stage 20 is locked in this state. Therefore, after that, the level and the inclination of the Z-leveling stage 20 are constant until the measurement is finished. The reason why autofocus is performed once, is to prevent the distribution of irregularities in the shot area SA from getting out of the detection area in the multipoint AF system.

However, in this embodiment, when there is a plane to be a reference plane inside or in the vicinity of the shot area SA, the autofocusing may be performed on this plane, instead of autofocusing at the measurement point P3 at the center of the slit image ST in Step 102. In this case, there is no need that a measurement point is P3, and a measurement point which is nearest to this plane may be selected. Further, a measurement point to be autofocused may be determined using the exposure process data. In short, the measurement point is not necessary to be P3, but may be any point in the scanning area, if the displacement value at the focus position, which is detected by the multipoint AF system, is not off from the detection area (which is determined by the S curve), when the wafer is scanned by the slit image ST by means of the multipoint AF system.

Next, in Step 103, the XY stage 21 is driven, so that the shot area SA is moved in the X-position to the measurement starting position SB before the slit image ST with respect to the direction of scanning. Then, in Step 104, the XY stage 21 is driven and the shot area Sa is scanned in the X-direction with respect to the slit image ST, and then the respective detection output signals FSa–FSe are stored in the memory in the correction operation art 30B. In this case, since the coordinate of the XY stage 21 is measured by a laser interferometer, the detection output signals FSa–FSe are sequentially stored at the addresses, which correspond to the coordinates measured by the laser interferometer, in the memory. Thereafter, in Step 105, the process difference in level in the shot area SA are classified based on the obtained detection output signals FSa–FSe (respective time series signals).

Figure 8:
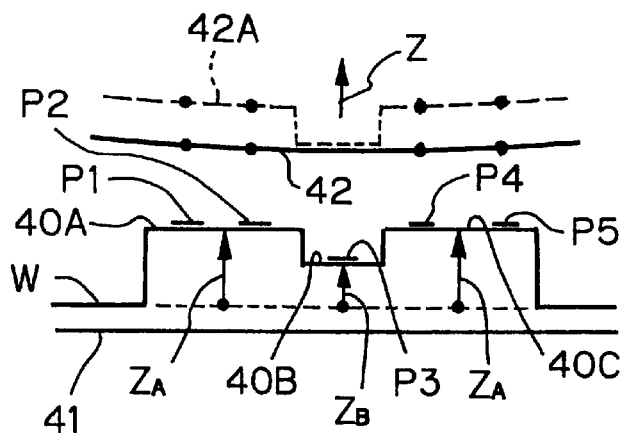
FIGS. 8(a) and 8(b) are respective explanatory views of offset values introduced in this embodiment.
Figure 8:
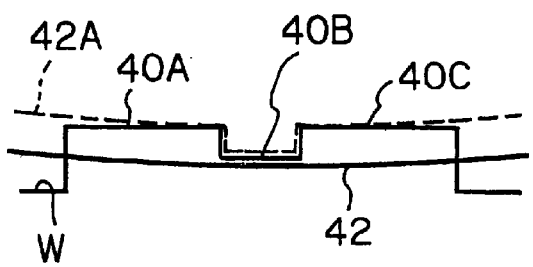

Concretely, FIG. 8($a$) shows a section in the shot area SA on the wafer W, and the measurement points P1–P5 are set at this section. Actually, a photoresist is coated on the wafer W, however, the photoresist is omitted. In FIG. 8($a$), when the respective measurement points P1–P5 are reached to the virtual reference plane 41 in the multipoint AF system, the corresponding detection output signals become zero respectively. And, it is assumed that the best image plane 42 of the projection optical system PL is off from the virtual reference plane 41 in some extent. In this case, when the detection output signals, which can be obtained at the respective measurement points P1–P5, are FSa–FSe, the values of these detection output signals correspond to the irregularities.

For example, when the measurement points P1, P2 are positioned on the pattern area 40A of the convex portion on the wafer W, the measurement point P3 is positioned on the pattern area 40B of the concave portion and the measurement positions P4, P5 are positioned on the pattern area 40C of the convex portion, the value of the detection output signal FSc at the measurement point P3 becomes minimum. With this feature, the correction operation part 30B in FIG. 7 in this embodiment obtains the differences in the detection output signals corresponding to the adjacent measurement points to thereby obtain the distribution of the concave and convex portions in the shot area. The correction operation part 30B is supplied with the data concerning to the process structure from the exposure process data memory part 30F, so that the correction operation part 30B can distinguish the pattern areas 40A to 40C in which the measurement points P1–P5 are positioned by comparing distribution of the concave and convex portions, which is obtained as described above, with the process structure.

With this arrangement, it can be determined that the respective pattern areas 40A–40C belong to any of a memory cell part, a peripheral circuit part (logic part) a scribe line or the like. The correction operation part 30B can recognize the difference in level $Z_A$ of the respective pattern area 40A, 40C and the difference in level $Z_B$ of the pattern area 40D by the supplied data. These differences in level are difference in heights from the portion on which there is no circuit pattern of the wafer W, and as described later, differences in these levels are important.

Further, the dispersion and the like of the detection output signal in each stepped area is obtained based on information regarding difference in level, which is obtained from the difference data between said adjacent measurement points, whereby a difference in level caused by a difference in the pattern intensity in each stepped area can be known. Therefore, stable measurement points around the measurement points P1–P5 can be also obtained.

Next, in Step 106, a surface to be focused on the shot area SA is determined as a focusing reference plane. For example, in FIG. 8($a$), it is presumed that a pattern, which has narrowest line width, is exposed on the pattern area 40B with the measurement point P3, and the pattern area 40B is a focusing reference plane. However, there is a case in that the broadest (large) pattern area (such as the pattern area 40A) in the shot area SA is the focusing reference plane. The focusing reference plane may be selected and determined in accordance with the priority of focusing (which is determined based on the pattern line width, the pitch and the like) of every pattern area in the shot area.

Then, in Step 107, offset values Δa–Δe for the detection output signals Fa–Fe in the measurement points P1–P5 are obtained. In FIG. 8($a$), if the conversion coefficient from the detection output signal to the displacement in the Z-direction is k, the offset value Δc for the detection output signal Fc at the measurement point P3 on the pattern area 40B which is the focusing reference plane is zero. The offset values Δa, Δb, Δd, Δe for the detection output signals Fa, Fb, Fd, Fe at the measurement points P1, P2, P4, P5 are $(Z_A-Z_B)/k$ respectively.

Next in Step 108, the correction operation part 30B adds the offset values Δa–Δe obtained in step 107 to the offset values BFa–BFe of the detection output signals on the best image plane 42 in FIG. 8($a$). This is equal to that the best image plane 42 shown by the solid line is converted to the best image plane 42A including the virtual difference in level shown by the dotted line, therefore, the pattern areas 40A–40C are focused to the virtual best image plane 42A.

That is, in Step 109, the correction operation part 30B supplies the detection output signals of the virtual best image plane 42A, i.e., (BFa+Δa)–(BFe+Δe) to the deviation detecting part 30C. The detection output signals Fa–Fe corresponding to the real pattern areas 40A–40C are supplied to the deviation detecting part 30C in real time. Then, the deviation detecting part 30C supplied to the drive 18 for the Z-leveling stage 20 such drive signals; as the square sum of the deviation between the offset values (BFa+Δa)–(BFe+Δe) and the detection output signals Fa–Fe obtained by using, for example, a least square method, become minimum. With this arrangement, as shown in FIG. 8($b$), the pattern area 40B which is the focusing reference plane coincides with the real best image plane 42. Then, in Step 110, the exposure operation is performed to expose the pattern with the narrowest line width with high resolution.

At that time, the pattern areas 40A, 40C other than the pattern area 40B are set within the focal depth of the projection optical system. However, in said Step 107, if the offset values Δa–Δe exceed the focal depth, for example, the focusing reference plane may be shifted in the Z-direction apparently in such a manner that the pattern areas 40A, 40C come into the focal depth by weighing the offset values Δa–Δe. This is available when the entire surface of the shot area is within the focal depth. Further, simply the focusing reference plane (pattern area 40B) may be shifted so that the pattern areas 40A, 40C are within the width of the focal depth.

Incidentally, as shown in FIG. 7, since this embodiment adopts a method of comparing a desired value with a real detection output signal in the deviation detecting part 30C, the offset values Δa–Δe of the differences in level are added to the best image plane 42 which is the desired value. However, in FIG. 7, when the method of offset-correcting the real detection output signal and supplying to the deviation detecting part 30C is adopted, the offset values Δa–Δe may be subtracted from the real detection output signals.

Further, in actual, the detection output signals at the measurement points, which are distributed over the entire surface of the shot area SA in FIG. 5, are obtained, whereby the irregular distribution of concave and convex portions on the entire surface of the shot area SA is discriminated. However, in FIG. 7, the detection output signals which are supplied from the ADC 30A in real time, are only the detection output signals at the five points on the slit image ST in FIG. 5. The inclination around the axis parallel with the slit image ST is not corrected only by using the data on the slit image ST. Then, the inclination of the wafer W around the axis parallel with the slit ST is corrected by such as an open loop. That is, the shot area SA is scanned with respect to the slit image ST, whereby, as shown in FIG. 8(a), the detection output signal of the virtual best image plane 42A and the detection output signal in the actual pattern area are obtained. Then, the relation between the control value for the drive 18 and the inclination of the Z-leveling stage 20 are obtained previously, and the inclination of the Z-leveling stage 20 is controlled so as to eliminate the difference between the detection output signal in the actual pattern area and the detection output signal fo the virtual best image plane 42A. Therefore, with the open loop control, the pattern area, on which the pattern with the narrowest line width distributing over the entire surface of the shot area SA in FIG. 5 is exposed, is generally focused onto the best image plane in the projection optical system PL.

Moreover, at Step 104 in FIG. 11, as shown as Step 104A, the detection output signals Fa–Fe may be stored in the memory whenever the XY stage 21 stops after stepping at a constant pitch in the X-direction, that is, at the constant pitch. With this method, the air fluctuation influence by the movement of the XY stage 21 can be reduced.

Instead of the operation in Steps 101–102, Steps 111–112 in FIG. 12 may be available. That is, in Step 111, first, the XY stage 21 is driven so as to move the shot area SA to the measurement starting position SB as shown in FIG. 5. And then, in step 112, the autofocusing is performed at the central measurement point P3 of the slit image ST in FIG. 5, and the focus position of the Z-leveling stage 20 is locked. Then, at Step 104 or 104A in FIG. 11, the detection output signals are sampled over the entire surface in the shot area SA. The processes after that are same as the operation in FIG. 11. In a sequence shown in FIG. 12, there is no loss for the action of the wafer stage 21, so that the measurement can be performed efficiently.

Further, in this embodiment, the travelling surface along which the Z-leveling stage 20 moves and the best image plane in the projection optical system PL are substantially parallel when the XY stage 21 is driven in FIG. 4. However, when the travelling surface along which the Z-leveling stage 20 moves and the image plane in the projection optical system PL are not parallel, the following correction operation is necessary. That is, the deviation (an inclination of an image plane, a curvature of an image plane and the like) between the travelling surface of the Z-leveling stage 20 and the image plane of the projection optical system PL while the XY stage 21 is driven is stored in the memory of the correction operation part 30B as a device constant. In this case, the detection output signal, which has been obtained by the method of Step 104 in FIG. 11, shows the measured result when the travelling surface of the Z-leveling stage 20 is a reference and, therefore, only the deviation value from the image plane, which has been memorized as the device constant, is added to the measured result.

And, in this embodiment, as shown in FIG. 5, the distribution of concave and convex portions is obtained in one shot area on the wafer W, however, the same measurements are performed in different some (more than one) shot areas on the wafer W and the obtained detection output signal are averaged, and then the distribution of concave and convex portions in the respective shot areas on the wafer may be obtained by comparing the averaged result with the process structure. With this arrangement, the effects such as the uneven coating can be reduced.

Next, in this embodiment, as shown in FIG. 5, the position in the Z-direction is detected in the predetermined shot area SA on the wafer W, however, the position in the Z-direction may be detected at a pitch which is 1/N (N is integer number) of the array pitch in than shot area over the entire surface of the wafer. Concretely, if the array pitch of the shot area in the X-direction is Px, the distance of between adjacent focus positional measurements is Px/N, wherein N is the integer number greater than 2. In this case, the detection output signal from the multipoint AF system changes repeatedly at the same cycle as the array pitch in the shot area.

In this case, when there is a foreign material such as dust on the exposure surface on the wafer or the exposure surface is deformed such as by camber of the wafer, the change in the output of the multipoint AF system in the shot area differs from that in another shot area. Thus, it is desirable for the shot area, in which the deviation from the average of the sampled detection outputs signals at the cycle corresponding to the array pitch in the shot area is above the predetermined threshold, to calculate separately an offset value of the detection output signal for the focusing reference plane. A process such as an assist process (operator call) may also be performed as an alarm or an error for the shot area which subject to the effect such as by the foreign material or camber.

Next, in this embodiment, the position in the Z-direction of the exposure surface on the wafer W (the focus position) is measured by the detection output signal FS which varies in an S-curve shape.

The curve 44 in FIG. 13 shows one of the detection output signals. In FIG. 13, conventionally, the section, in which the curve 44 can be approximated by the straight line 45, is used to obtain the position in the Z-direction from the detection output signal FS. However, this method has a disadvantage that the position detecting area in the Z-direction is narrow. Therefore, to broaden the position detecting area, for example, the detection output signal FS (actually, the detection output signals FSa–FSe are measured respectively) while the Z-leveling stage 20 in FIG. 4 is moved in the Z-direction at the moving pitch $\Delta Z$ stored in the memory, that is, it is desirable that the curve 44 in FIG. 13 is obtained approximately. In this case, the value of the detection output signal FS is stored for the position in the Z-direction.

Then, when the position in the Z-direction is measured actually, if the value of the detection output signal FS is $V_i$, the position $Z_i$ in the Z-direction can be obtained correctly from the curve 44. However, if the curve 44 is approximated by the straight line 45, the position in the Z-direction is $Z_n$ when the detection output signal is $V_i$, so that an error occurs.

Next, in the above embodiment, the inclination of the Z-leveling stage 20 is controlled based on the actually measured result. However, the inclination of the image plane of the projection optical system PL relative to the surfaces of the XY stage 21 along which the Z-leveling stage moves is already known and, therefore, the inclination may be controlled previously by the Z-leveling stage 20. With this arrangement, when the position in the Z-direction is detected by means of the multipoint AF system, the angular offset in the angle of inclination can be reduced, so that an offset value calculated every measurement point becomes small. Therefore, the time for focusing can be shortened and the focusing accuracy can be improved.

In the above embodiment, as shown in FIG. 4, with the angle of inclination of the plane parallel 12 placed in the light-receiving system of the multipoint AF system, the positional relation between the virtual reference plane and the best image plane in the multipoint AF system can be adjusted. This also means that the offset values which occur in the detection output signals FS–FSe in common can be eliminated by the angle of inclination of the plane parallel 12.

However, when the plane parallel 12 is provided only for the light-receiving system side, the correction volume is small, so that a plane parallel may be arranged at the light-sending system side. In this way, an image position is corrected by two plane parallel, whereby the correction volume of the image position can be made large. Further, the plane parallels are arranged both of the light-sending system and the light-receiving system so as to correct the image position, whereby the positional displacement of a bright and dark pattern on the wafer can be corrected also.

If a plane parallel is arranged in the light-sending system in the multipoint AF system and when a common offset correction is performed using this plane parallel, for example, in Step 109 in FIG. 11, the positional displacement on the slit image ST on the wafer W is created between the case where the detection output signal is measured in Step 104 and the case where the detection output signal is measured in Step 109. Then, in order to reduce the influence of the positional displacement, the positional displacement value of the slit image ST on the wafer W relative to the angle of inclination of the plane parallel is measured previously, and the offset values to be added to the offset values of the best image plane for the respective measurement points may be corrected based on the previously measured positional displacement value.

Figure 14:
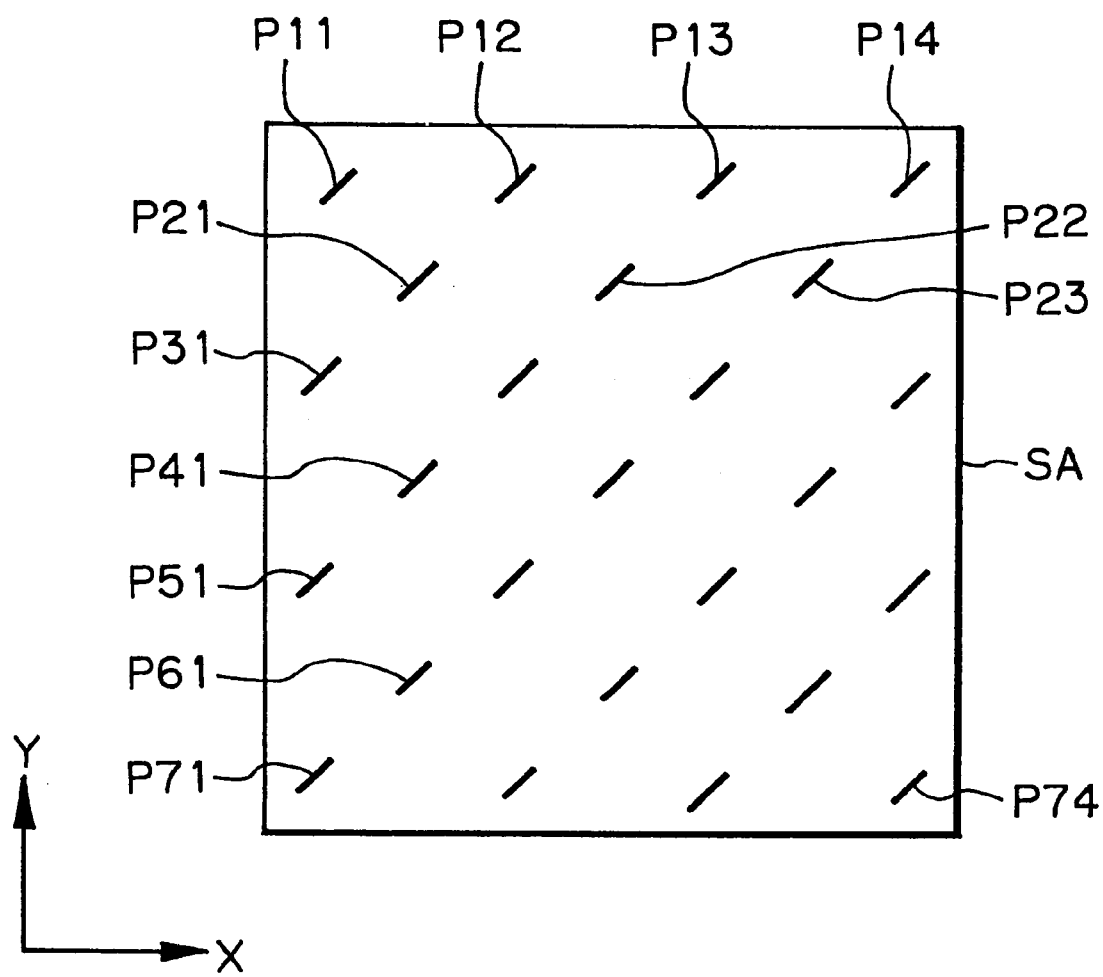
FIG. 14 is an enlarged plan view showing a case in which slit images are respectively projected onto the measurement points which distribute two-dimensionally in the shot area on a wafer.

Next, in the above embodiment, as shown in FIG. 5, the slit image ST for detecting the position in the Z-direction is projected obliquely in the diagonal direction relative to the shot area SA on the wafer W, and five points on the slit image ST are selected as the measurement points P1–P5. On the other hand, as shown in FIG. 14, N (N is 25 in FIG. 14) measurement points P11, P12, . . . . P74 may be set two-dimensionally in the X-direction and the Y-direction with a predetermined pitch, and pattern images for detecting the focus may be projected on the measurement points, respectively. In this case, the number of receiving elements (receiving picture elements) for receiving the respective pattern images is the same as the number of measurement points. Thus, for example, if a synchronous detection method is used, it is difficult to process the photoelectric transfer signals of the pattern images from all measurement points in parallel. Therefore, for example, using the selector circuit sections 13A–13E shown in FIG. 7, five photoelectric transfer signals are selected from the total photoelectric transfer signals (total number is N), and the synchronous detection may be performed time-divisionally. With the time-division method, the circuit structure can be made simple.

In order to detect the focus, instead of projection the slit image, such as a grid-like fright and dark pattern with predetermined pitches may be projected obliquely on the wafer. In this case, using the reflected light from the wafer, the grid-like bright and dark pattern is re-imaged on a two-dimensional image pickup element such as, for example, a two-dimensional CCD, and the positional displacement value in the Z direction on the exposure surface on the wafer can be obtained in accordance with the horizontal displacement value of the re-imaged image.

A method wherein the slit image is projected, and the position of the pattern image which is re-imaged on one-dimensional line sensor or the like may be detected so as to obtain the positional displacement value in the Z direction is also applicable. In this method, a plane parallel for calibration is not necessary, and an electric offset may be used. At least one measurement point may be set for each of at least two pattern areas (including a scribe line and the like) the levels of which are different in the short area. However, for example, when a plurality of measurement points are set in the respective pattern areas, and when offset values $\Delta a$–$\Delta e$ are obtained, the plurality of measurement points are processed in a statistical or an averaging, or weighted-averaging method for every area, and when the autofocusing is performed, the obtained offset value is applied to one measurement point for every area and the detection output signal at that measurement point may be used. In short, when there exists a plurality of measurement points in one pattern area, it is not necessary to obtain offset values for the respective measurement points and to perform autofocusing so as to fit all of the shot surfaces with the respective image planes at each of the plurality of measurement points, so that an offset value at least one measurement point may be obtained for every pattern area and the autofocusing may be performed using the measurement point.

Next, in the oblique incident type AF system (the focus position detecting system) shown in FIG. 4 of this embodiment, a light having a wavelength to which the photo-resist on the wafer W is not or less sensitive is used as the illumination light IL for detecting the focus. Further, in the photoresist, a thin film interference occurs by the incident light beam and, therefore, when the light beam is a monochromatic light, there is a case in that the intensity of the reflected light becomes very faint by the thickness of the photoresist. Then, in order to reduce the adverse effect by the thin film interference, it is desirable to use the light beam having a band-pass width more than 100 nm as the illumination light IL. More specifically, as an illumination light, the light beam having a wavelength width such as 700 nm–900 nm, which has been selected from the light beam illuminated from a halogen lamp through the wavelength selecting filter, can be used. And, the illumination light having the wavelength width about 700 nm –900 nm from a light emitting diode may be used. Further, a plurality of monochromatic lights, which can be obtained by mixing light beams from a plurality of semiconductor laser elements or the like, may be used as the illumination light IL.

However, when a light beam having predetermined wavelength width or having a plurality of wavelength is used as the illumination light IL and the distribution of the light intensity to the wavelength is not uniform, for example, the light intensity of a specific wavelength is strong, there is a danger that the illuminating light. is influenced by a thin film interference effect with the specific wavelength. Thus, in order to avoid this effect, as shown in FIG. 4, it is desirable that the optical filter plate 60 for equalizing the distribution of the photo-electric transfer signal for the wavelength is arranged in front of the array sensor 15 of the AF system. In addition, the optical filter plate 60 may be placed at any position between a light source, not shown, for generating the illumination light IL and the array sensor 15.

Figure 15:
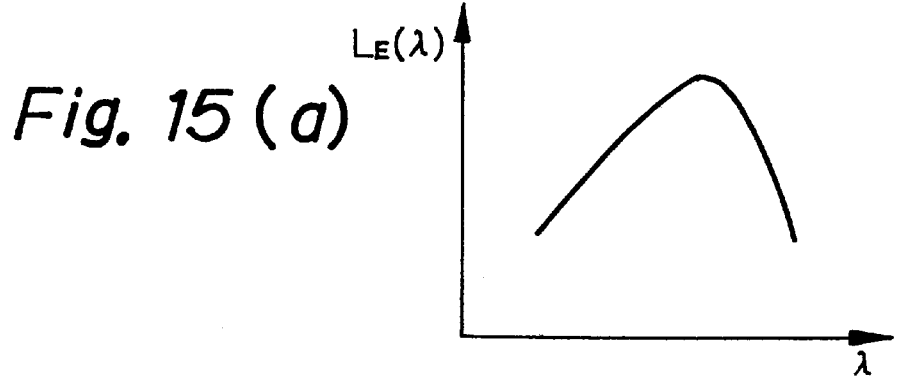
FIG. 15(a) is a view showing-the wavelength characteristics of the illumination light used in the AF system in a modified embodiment according to the present invention.
FIG. 15(b) is a view showing the transmittance distribution of the optical filter plate 60 used in the modified embodiment.
FIG. 15(c) is a view showing the wavelength characteristics of the light beam received by the array sensor 15, and the wavelength sensitive characteristics of the array sensor 15
FIG. 15(d) is a view showing the wavelength characteristics of the photoelectric transfer signal outputted from the array sensor 15.
Figure 15:
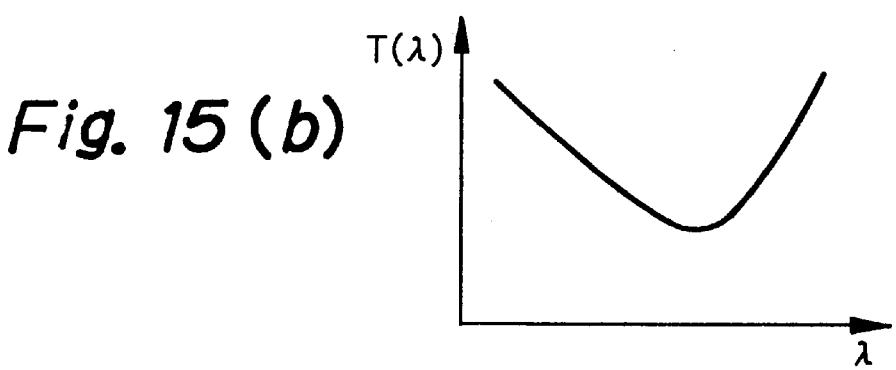
Figure 15:
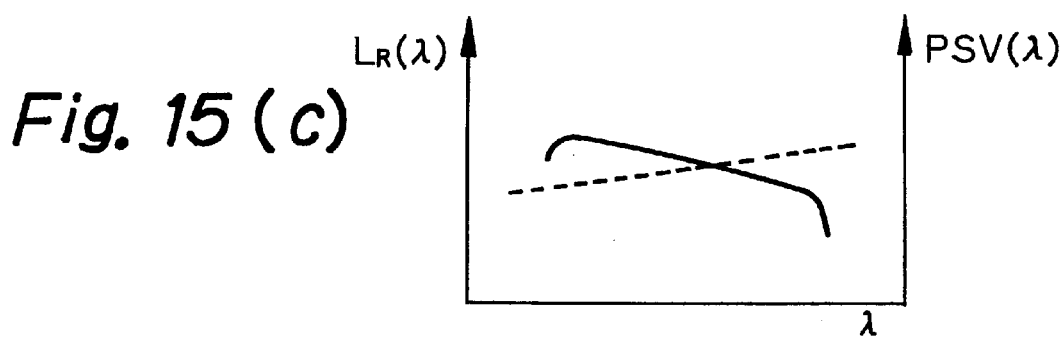
Figure 15:
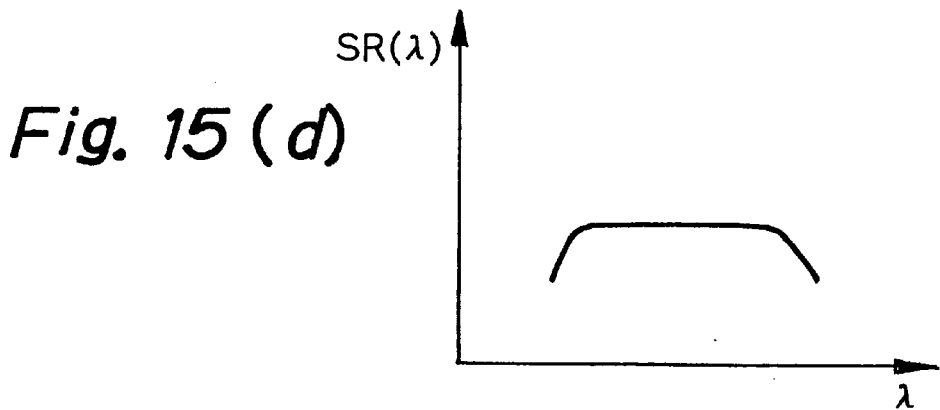

Referring to FIG. 15, a concrete explanation will be given to one example of the characteristics of the optical filter plate 60. First, it is assumed that the distribution of the light intensity $L_E(\lambda)$ for the wavelength $\lambda$ of the illumination light IL is generally a V shape as shown in FIG. 15(a). In this case, the distribution of the transmittance T ($\lambda$) for the wavelength $\lambda$ of the optical filter plate 60 is set in a substantial inverted V shape, as shown in FIG. 15(b). However, the transmittance T ($\lambda$) is corrected in consideration of the wavelength sensitive characteristics in the array sensor 15.

That is, it is presumed that the detection sensitivity (output signal/incident light intensity) PSV ($\lambda$), for the wavelength $\lambda$ in the array sensor 15 increases as the wavelength $\lambda$ increases, as shown by the dotted line in FIG. 15(c). In this case, the distribution of the light intensity $L_R(\lambda)$ for the wavelength $\lambda$ of the light beam, which is received by the array sensor 15 through the optical filter plate 60 is product of the light intensity $L_E(\lambda)$ and the transmittance T ($\lambda$), so that the distribution of the transmittance T ($\lambda$) is set in such a manner that the distribution of the light intensity $L_R(\lambda)$ slightly decreases as the wavelength $\lambda$ increases, as shown by the solid line in FIG. 15(c). In this case, the photoelectric transfer signal SR ($\lambda$) outputted from the array sensor 15 for the light beam having the wavelength $\lambda$ is product of the detection sensitivity PSV ($\lambda$) and the light intensity $L_R(\lambda)$, so that it becomes almost even relative to change in the wavelength $\lambda$. With this arrangement, the adverse effect of the thin film interference on the photoresist can be reduced, so that the difference in level on the wafer surface can be measured stably.

Moreover, the present invention should not be limited to this, so that various structures can be applied within a limitation which is not beyond the points of the present invention.

According to the present invention, arithmetic unit is provided for obtaining offset values for fitting the focusing reference plane on the substrate to the image plane by the projection optical system for each of a plurality of measurement points separately, based on the respective detected signals of the photoelectric detecting device corresponding to the plurality of measurement points and the process structure of the exposure surface of the substrate, therefore, there is an advantage that the respective exposure areas (shot areas) can be fitted to the image planes of the projection optical system and exposed under optimum condition irrespective of an irregular condition in the respective shot areas on the substrate.

Moreover, in the case where the substrate stage is driven so as to move the substrate with the image of the focus-detecting pattern being projected from the focusing projection optical system onto the exposure area of the projective optical system, whereby the detection signals of the photoelectric detecting devices corresponding to the plurality of measurement points which are distributed over the entire surface in the exposure area are obtained respectively; and in the case where the arithmetic unit obtaining offset value for fitting the focusing reference plane on the substrate to the image plane by the projective optical system for each of the plurality of measurement points separately, based on the detection signals of the photoelectric detecting device at the measurement points which are distributed over the entire surface and the process structure of the exposure on the substrate the irregular condition of the entire surface in the exposure area on the substrate can be measured rapidly by using an optical system for focus-detecting having simple structure. Therefore, there is an advantage that in an optimum condition the entire surface of the exposure area can be fitted to the image plane by the projection optical system so as to be exposed. And, although the surface of a holding tool (such as a wafer holder) for the substrate is not flat, there is a camber in the substrate or there is foreign materials and the like between the substrate and the holding tool, a focusing error caused by the above matters can be prevented. That is, the entire surface of the exposure area and the image plane can be fitted to each other or set in the focal depth.

Further, in the case where a light beam having a band-pass width more than 100 nm is used when the pattern image for focus-detecting is projected from the projection optical system onto the exposure area by the projection optical system, there is an advantage that an adverse effect of the thin film interference in the photosensitive material (photoresist and the like) on the substrate can be reduced. There is a case that the light beam is diverged or diffracted by the irregular edge portion and the like on the substrate, however, if a light beam having wide band-pass is used, there is an advantage that the detection signal having a fine SN ratio can be obtained, even if the light beam of the specific wavelength is feeble.

Moreover, when the optical filter for uniforming the wavelength sensitive characteristics of the light beam used while the pattern image for focus-detecting is projected is arranged in the optical path from the projection optical system to the plurality of photoelectric detecting devices, for example, in a case where the light beam with a wide band-pass width is used, the distribution of intensity of the detection signal outputted from the photoelectric detecting device relative to the wavelength is substantially flatten. Therefore, the distribution in level of the exposure surface on the substrate can be measured correctly, without an influence of the light having a predetermined wavelength.

Next, when the arithmetic unit corrects a desirable value according to the level of the image plane by the projection optical system based on the offset values which are obtained separately at respective plural measurement points, the closed loop control is performed so as to coincide the corrected desirable value with the actually obtained detection signal, whereby the focusing and the leveling can be performed with a high degree of accuracy.

As described above, the explanation is given to the preferred embodiment, however, needless to say that person those skilled in the art can make a modification or revision in the scope of the present invention based on the above disclosure.

What is claimed is:

1. An exposure method for projecting an image of a pattern on a mask onto a substrate through a projection system, comprising:
    detecting a positional information of said substrate in a direction along an optical axis of said projection system at a plurality of measurement points which are set beforehand in a predetermined positional relation with respect to an image field of said projection system;
    scanning said plurality of measurement points and a plurality of shot areas on said substrate relative to each other;
    obtaining said positional information at a plurality of points in each of said shot areas in connection with relative movement between said plurality of measurement points and said plurality of shot areas; and
    obtaining distribution of concave and convex portions in each of said shot areas.

2. An exposure method according to claim 1, wherein the process difference in level in said shot area is classified based on said distribution of concave and convex portion in each of said shot areas.

3. An exposure method according to claim 2, wherein, among a plurality of stepped areas obtained by said classification, the stepped area on which a pattern with the narrowest line width is projected is determined as a focusing reference plane for aligning said stepped areas of said pattern with an image plane of said projection system.

4. An exposure method according to claim 1, wherein offset information for positional information obtained at said plurality of measurement points is obtained based on said distribution of concave and convex portion in said plurality of shot areas.

5. An exposure method according to claim 1, wherein an average distribution of concave and convex portion in said shot areas is obtained by averaging said distribution of concave and convex portion in each of said shot areas.

6. An exposure method according to claim 5, further comprising:

adjusting a relative position in a direction along an optical axis of said projection system between said substrate and an imaging plane of said projection system based on a detected result of the position of said substrate in said direction obtained at said plurality of measurement points and said averaged distribution of convex and concave portion in said shot area, when said substrate area is exposed.

7. A method of manufacturing a semiconductor device using the exposure method set forth in claim 1 comprising an exposing step of projecting an image of a pattern on a mask onto a substrate through a projection system.

8. A projection exposure method for projecting an image of a pattern on a mask onto a substrate placed on a stage through a projection optical system, comprising steps of:

detecting a positional information of said substrate in a direction along an optical axis of said projection system at a plurality of measurement points which are set beforehand in a predetermined positional relation with respect to an image field of said projection system;

moving said stage to scan said plurality of measurement points and a shot area on said substrate relative to each other;

obtaining said positional information at a plurality of points in said shot area in connection with relative movement between said measurement light and said plurality of shot areas; and obtaining distribution of concave and convex portions in said shot area based on said positional information and information of a travelling surface of said stage.

9. A projection exposure method according to claim 8, wherein the process difference in level in said shot area is classified based on said distribution of concave and convex portion in each of said shot areas.

10. A projection exposure method according to clam 9, wherein, along a plurality of stepped areas obtained by said classification, the stepped area on which a pattern with the narrowest line width is projected is determined as a focusing reference plane for aligning said stepped areas of said pattern with an image plane of said projection system.

11. A projection exposure method according to claim 8, wherein an offset information for positional information obtained at said plurality of measurement points is obtained based on said distribution of concave and convex portion in said plurality of shot areas.

12. A projection exposure method according to claim 8, further comprising:

adjusting a relative position in a direction along an optical axis of said projection system between said substrate and an imaging plane of said projection optical system based on a detected result of the position of said substrate in said direction obtained at said plurality of measurement points and said distribution of convex and concave portion in said shot area, when said substrate is exposed.

13. A method for manufacturing a semiconductor device using the exposure method set forth in claim 8 comprising an exposing of projecting an image of a pattern on a mask onto a substrate through a projection system.

14. An exposure apparatus which projects an image of a pattern on a mask onto a substrate through a projection system, comprising:

a detector which detects a positional information of said substrate in a direction along an optical axis of said projection system at a plurality of measurement points which are set beforehand in a predetermined positional relation with respect to an image field of said projection system;

a scanning system which scans said plurality of measurement points and a plurality of shot areas on said substrate relative to each other;

a controller which is connected to said detector and said scanning system and obtains said positional information at a plurality of points in each of said shot areas in connection with relative movement between said plurality of measurement points and said plurality of shot areas; and a calculation system which is connected to said controller and obtains distribution of concave and convex portions in each of said shot areas.

15. An exposure apparatus according to claim 14, wherein said calculation system classifies the process difference in level in said shot area based on said distribution of concave and convex portion in each of said shot areas.

16. An exposure apparatus according to claim 15, wherein said calculating system determines the stepped area on which a pattern with the narrowest line width is projected among a plurality of stepped areas obtained by classification as a focusing reference plane for aligning said image of said pattern with an image plane of said projection system.

17. An exposure method according to claim 14, wherein said calculation system obtains an offset information for positional information obtained at said plurality of measurement points based on said distribution of concave and convex portion in said plurality of shot areas.

18. An exposure method according to claim 14, wherein said calculation system obtains an average distribution of concave and convex portion in said shot areas by averaging said distribution of concave and convex portion in each of said shot areas.

19. An exposure apparatus according to claim 18, wherein said controller adjusts a relative position in a direction along an optical axis of said projection system between said substrate and an imaging plane of said projection system based on a detected result of the position of said substrate in said direction obtained at said plurality of measurement points and said averaged distribution of convex and concave portion in said shot areas, when said substrate is exposed.

20. A projection exposure apparatus which projects an image of a pattern on a mask onto a substrate placed on a stage through a projection optical system; comprising:

a detector which detects a positional information of said substrate in a direction along an optical axis of said projection system at a plurality of measurement points which are set beforehand in a predetermined positional relation with respect to a image field of said projection system;

a scanning system which moves said stage to scan said plurality of measurement points and a shot area on said substrate relative to each other;

a controller which is connected to said detector and said scanning system and obtains said positional information at a plurality of points in said shot area in connection with relative movement between said measurement light and said plurality of shot areas; and a calculating system which is connected to said controller and obtains distribution of concave and convex portions in said shot area based on said positional information and information of a travelling surface of said stage.

21. A projection exposure apparatus according to claim 20, wherein said calculating system classifies the process difference in level in said shot area based on said distribution of concave and convex portion in each of said shot areas.

22. A projection exposure method according to claim 21, wherein, among a plurality of stepped areas obtained by said classification, the stepped area on which a pattern with the narrowest line width is projected is determined as a focusing reference plane for aligning said stepped areas of said pattern with an image plane of said projection system.

23. A projection exposure method according to claim 20, wherein said calculating system obtains an offset information for positional information obtained at said plurality of measurement points is obtained based on said distribution of concave and convex portion in said plurality of shot areas.

24. A projection exposure method according to claim 20, wherein said controller adjusts a relative position in a direction along an optical axis of said projection system between said substrate and an imaging plane of said projection optical system based on a detected result of the position of said substrate in said direction obtained at said plurality of measurement points and said distribution of convex and concave portion in said shot area, when said substrate is exposed.

* * * * *

UNITED STATES PATENT AND TRADEMARK OFFICE
CERTIFICATE OF CORRECTION

PATENT NO.    : 6,327,025 B1
DATED         : December 4, 2001
INVENTOR(S)   : Yuji Imai It is certified that error appears in the above-identified patent and that said Letters Patent is hereby corrected as shown below:

<u>Title page,</u>
Item [63], Related U.S. Application Data, change "Continuation of application No. 09/323,042, …" to be -- Division of application No. 09/323,042, …. --

Signed and Sealed this

Tenth Day of September, 2002

*Attest:*

*Attesting Officer*

JAMES E. ROGAN
*Director of the United States Patent and Trademark Office*